United States Patent
Konaka et al.

(10) Patent No.: US 12,294,353 B2
(45) Date of Patent: May 6, 2025

(54) ACOUSTIC WAVE ELEMENT, ACOUSTIC WAVE FILTER DEVICE, AND MULTIPLEXER

(71) Applicant: Murata Manufacturing Co., Ltd., Nagaokakyo (JP)

(72) Inventors: Yohei Konaka, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 386 days.

(21) Appl. No.: 17/719,522

(22) Filed: Apr. 13, 2022

(65) Prior Publication Data

US 2023/0336158 A1 Oct. 19, 2023

(51) Int. Cl.
| | | |
|---|---|---|
| H03H 9/64 | (2006.01) | |
| H03H 9/02 | (2006.01) | |
| H03H 9/145 | (2006.01) | |
| H03H 9/25 | (2006.01) | |

(52) U.S. Cl.
CPC ...... *H03H 9/6483* (2013.01); *H03H 9/02637* (2013.01); *H03H 9/02992* (2013.01); *H03H 9/14541* (2013.01); *H03H 9/25* (2013.01)

(58) Field of Classification Search
CPC .... H03H 9/6483; H03H 9/25; H03H 9/14541; H03H 9/02992; H03H 9/02637
See application file for complete search history.

(56) References Cited

U.S. PATENT DOCUMENTS

| | | |
|---|---|---|
| 2004/0233018 A1 | 11/2004 | Watanabe et al. |
| 2014/0049340 A1 | 2/2014 | Inoue |
| 2017/0222624 A1* | 8/2017 | Kishino ............ H03H 9/02685 |
| 2018/0109243 A1* | 4/2018 | Takamine ............ H03H 9/72 |
| 2020/0007110 A1* | 1/2020 | Konaka ............ H03H 9/725 |

FOREIGN PATENT DOCUMENTS

| | | | |
|---|---|---|---|
| JP | 2003087096 A | * | 3/2003 |
| JP | 2004-343573 A | | 12/2004 |
| JP | 2014-039199 A | | 2/2014 |
| WO | 2016/017730 A1 | | 2/2016 |
| WO | 2016/208670 A1 | | 12/2016 |
| WO | 2018/168836 A1 | | 9/2018 |

OTHER PUBLICATIONS

JP-2003087096-A (Machine Translation) (Year: 2003).*
Official Communication issued in International Patent Application No. PCT/JP2018/009678, mailed on Jun. 5, 2018.

* cited by examiner

*Primary Examiner* — Yuqing Xiao
*Assistant Examiner* — Christopher Richard Walker
(74) *Attorney, Agent, or Firm* — Keating & Bennett, LLP

(57) ABSTRACT

An acoustic wave element includes a piezoelectric substrate, an IDT electrode on the piezoelectric substrate, and a reflector. The IDT electrode includes plural electrode fingers, and the reflector includes plural reflector electrode fingers. In a case where IRGAP is an IDT-reflector gap that is a distance between a center of the electrode finger located closest to the reflector and a center of the reflector electrode finger located closest to the IDT electrode, and $\lambda_{REF}$ is a reflector wave length that is twice a repetition pitch of the reflector electrode fingers, a ratio of about $0.25 \leq IRGAP/\lambda_{REF} \leq about\ 0.44$ is satisfied, and the reflector wave length is longer than an IDT wave length that is a repetition pitch of the electrode fingers.

19 Claims, 23 Drawing Sheets

—— PRACTICAL EXAMPLE: $\lambda_{REF}/\lambda_{IDT}$:1.013, IRGAP/$\lambda_{REF}$:0.4
----- COMPARATIVE EXAMPLE: $\lambda_{REF}/\lambda_{IDT}$:1.000, IRGAP/$\lambda_{REF}$:0.5

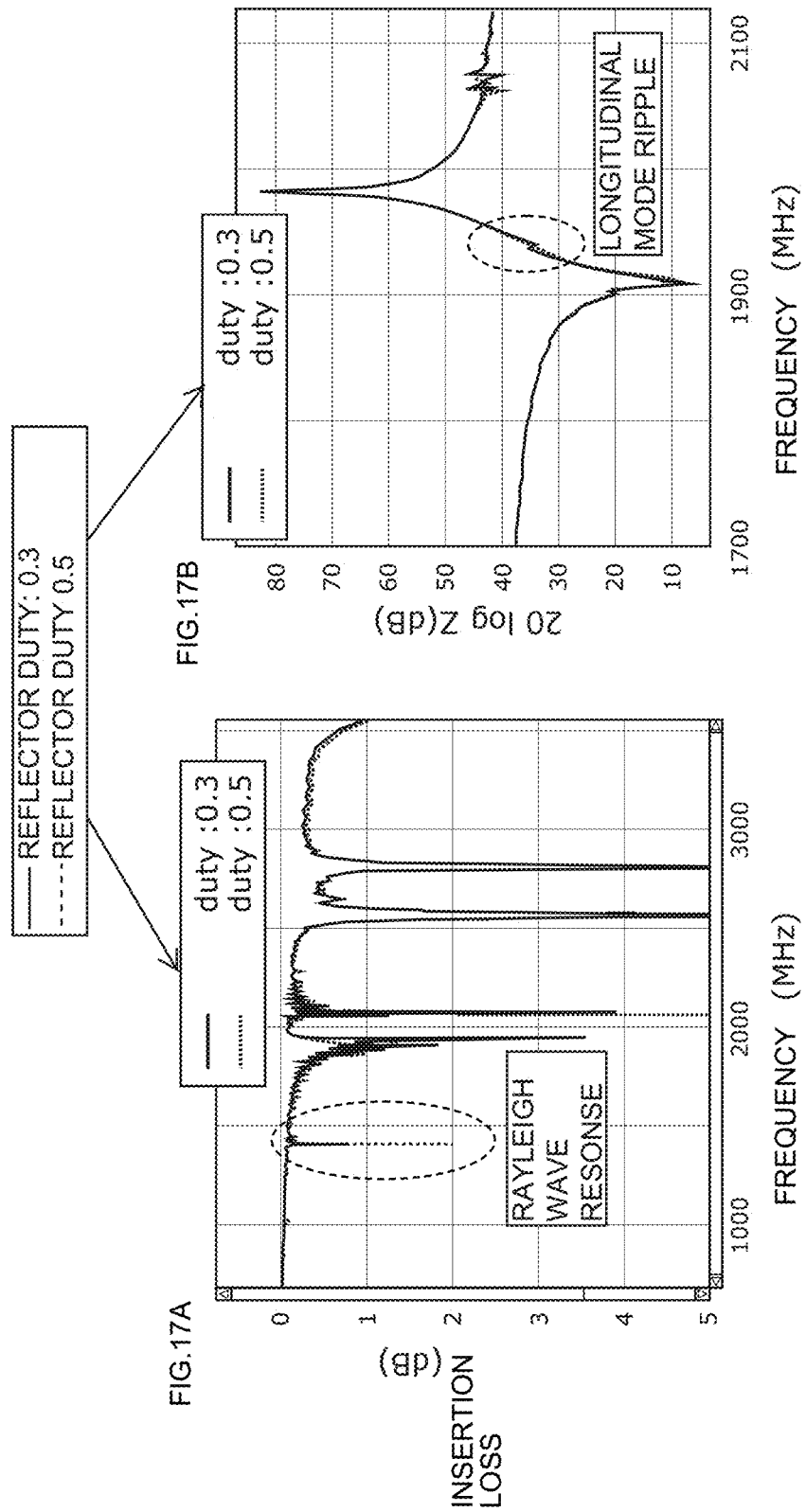

FIG.18A

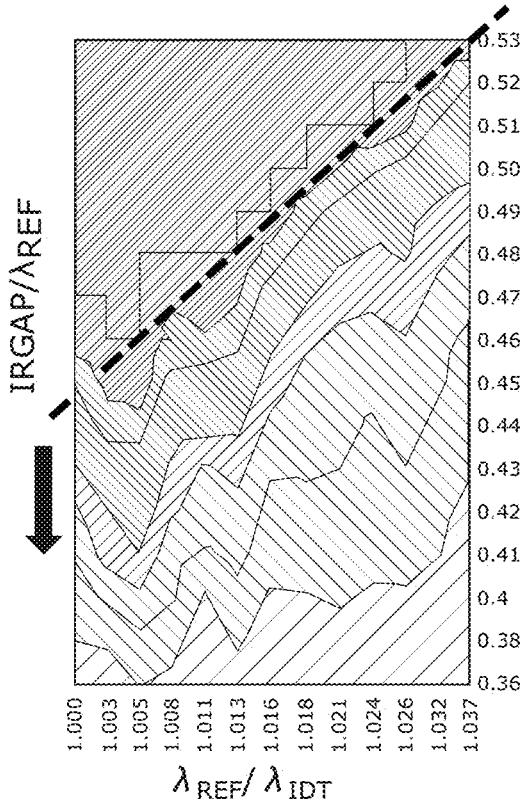

$$\frac{IRGAP}{\lambda_{REF}} \leqq 2.724 \times \left(\frac{\lambda_{REF}}{\lambda_{IDT}}\right) - 2.3017$$

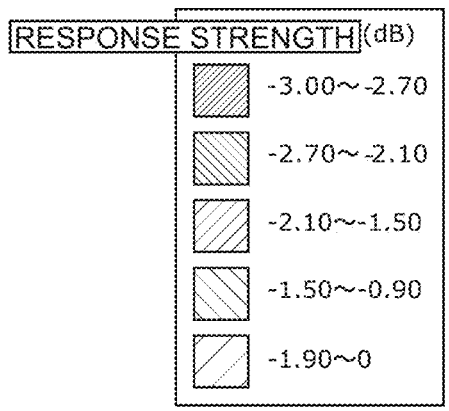

FIG.18B

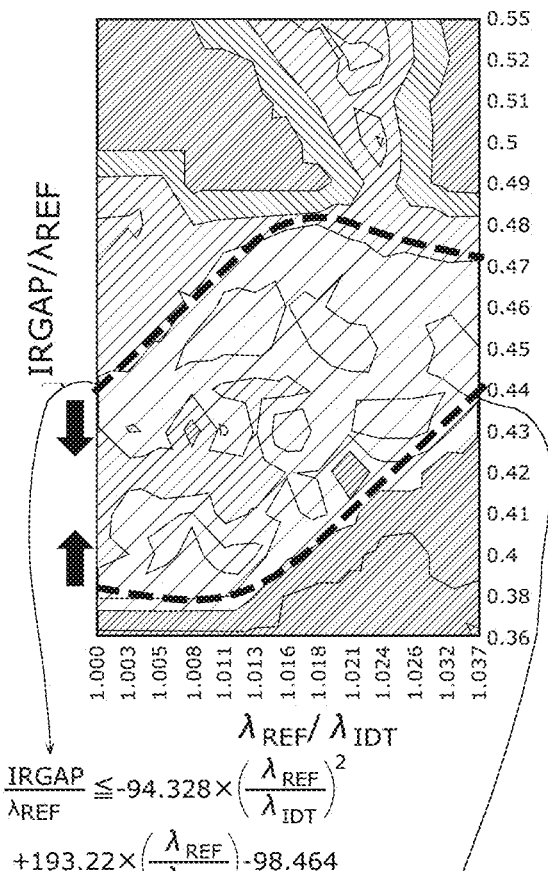

$$\frac{IRGAP}{\lambda_{REF}} \leqq -94.328 \times \left(\frac{\lambda_{REF}}{\lambda_{IDT}}\right)^2 + 193.22 \times \left(\frac{\lambda_{REF}}{\lambda_{IDT}}\right) - 98.464$$

$$\frac{IRGAP}{\lambda_{REF}} \geqq 24.028 \times \left(\frac{\lambda_{REF}}{\lambda_{IDT}}\right)^2 - 47.833 \times \left(\frac{\lambda_{REF}}{\lambda_{IDT}}\right) + 24.203$$

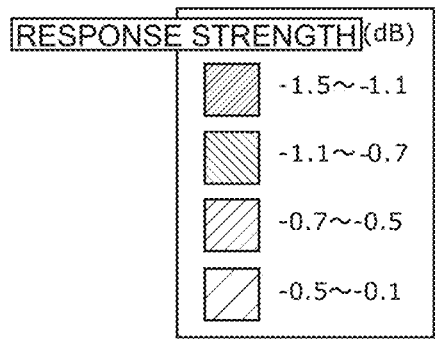

ACOUSTIC WAVE ELEMENT, ACOUSTIC WAVE FILTER DEVICE, AND MULTIPLEXER

BACKGROUND OF THE INVENTION

1. Field of the Invention

The present invention relates to an acoustic wave element, an acoustic wave filter device, and a multiplexer.

2. Description of the Related Art

In recent years, a multi-band system has been used in order to improve the data transmission rate of a cellular phone. In such a case, because transmission and reception in plural frequency bands may be performed, plural filter devices that allow high frequency signals in different frequency bands to pass are arranged in a front end circuit of the cellular phone. In this case, because the permissible mounting space in the front end circuit is restricted, the plural filter devices are required to achieve size reduction, high isolation from adjacent bands, and low loss in pass bands.

Japanese Unexamined Patent Application Publication No. 2004-343573 discloses a configuration of a surface acoustic wave device that improves transmission characteristics. More specifically, the surface acoustic wave device includes plural surface acoustic wave resonators that include an interdigital transducer (IDT) electrode and a reflector and has a circuit configuration in which the plural surface acoustic wave resonators are arranged as serial arm resonators and longitudinally coupled resonators. In the circuit configuration, in order to improve the transmission characteristics, which are an amplitude difference and a phase difference between balanced terminals, an electrode finger pitch in a periphery of the boundary of the IDT electrodes is set as a narrow pitch. All of the intervals between the IDT electrodes and the reflectors are set to 0.50 times a wave length λ that is provided by the electrode finger pitch of the IDT electrode.

However, there is a problem in that in the plural surface acoustic wave resonators that define the surface acoustic wave device described in Japanese Unexamined Patent Application Publication No. 2004-343573, because reflection becomes large in the IDT electrode if the number of pairs of electrode fingers of the IDT electrode is decreased in order to achieve size reduction, the bandpass characteristics degrade due to an influence of a spurious response that is generated particularly on a lower frequency side than the resonant frequencies of the surface acoustic wave resonators or on a higher frequency side than the anti-resonant frequencies of the surface acoustic wave resonators.

SUMMARY OF THE INVENTION

Preferred embodiments of the present invention provide acoustic wave elements, acoustic wave filter devices, and multiplexers that reduce or prevent an increase in return loss on a lower frequency side than resonant frequencies of acoustic wave resonators or on a higher frequency side than anti-resonant frequencies of the surface acoustic wave resonators, even if the number of pairs of electrode fingers of the IDT electrode is decreased.

An acoustic wave element according to a preferred embodiment of the present invention causes a high frequency signal to propagate in a prescribed propagation direction of an acoustic wave. The acoustic wave element includes a substrate that includes a piezoelectric layer; an IDT electrode that is provided on the substrate and includes one pair of comb-shaped electrodes which are opposed to each other; and a reflector that is disposed adjacent to the IDT electrode in the propagation direction of the acoustic wave. Each of the comb-shaped electrodes of the pair of comb-shaped electrodes includes a plurality of electrode fingers which extend in a direction intersecting with the propagation direction of the acoustic wave and a busbar electrode which connects respective one ends of the plurality of electrode fingers together. The reflector includes a plurality of reflector electrode fingers which extend in the direction intersecting with the propagation direction of the acoustic wave. In a case where IRGAP is an IDT-reflector gap, which is a distance between a center of one of the plurality of electrode fingers which is positioned closest to the reflector and a center of one of the plurality of reflector electrode fingers which is positioned closest to the IDT electrode in a boundary region between the IDT electrode and the reflector, and $\lambda_{REF}$ is a reflector wave length that is twice a repetition pitch of the plurality of reflector electrode fingers, a ratio of about $0.25 \leq IRGAP/\lambda_{REF} \leq$ about $0.44$ is satisfied. The reflector wave length, $\lambda_{REF}$, is longer than an IDT wave length, $\lambda_{IDT}$, that is a repetition pitch of the plurality of electrode fingers of the comb-shaped electrode.

In an acoustic wave resonator that is provided on the substrate which includes the piezoelectric layer, return loss may increase due to response characteristics of the IDT electrode as a reflector on a lower frequency side than a resonant frequency of the acoustic wave resonator. Particularly, as the number of pairs of electrode fingers of the IDT electrode is decreased so as to achieve size reduction, the return loss tends to increase.

By contrast, in the above-described configuration, the IDT-reflector gap is set to not more than about 0.45 times the reflector wave length, and a spurious response due to reflection in the boundary between the IDT electrode and the reflector is thus generated in a periphery of a low frequency end of a stop band of the reflector. In a state where such a spurious response are generated, a generation frequency of the spurious response is shifted to a low frequency side by making the reflector wave length longer than the IDT wave length, and it thus becomes possible to cancel, by the spurious response, the response characteristics of the IDT electrode as a reflector on a lower frequency side than the resonant frequency of the acoustic wave resonator. Accordingly, even if the number of pairs of electrode fingers of the IDT electrode is decreased, an increase in the return loss on a lower frequency side than the resonant frequency of the acoustic wave resonator is reduced or prevented.

Further, the position of a high frequency end of the stop band is shifted, and the generation frequency of reflection response that reflects the generation frequency of the stop band and the reflector wave length may thus be changed. Accordingly, it becomes possible to disperse the reflection response at the high frequency end of the stop band (on a higher frequency side than an anti-resonant frequency of the acoustic wave resonator).

Further, the substrate may include the piezoelectric layer on one main surface of which the IDT electrode is provided; a high acoustic velocity support substrate in which an acoustic velocity of a propagating bulk wave is higher than an acoustic velocity of an acoustic wave which propagates through the piezoelectric layer; and a low acoustic velocity film which is arranged between the high acoustic velocity support substrate and the piezoelectric layer and in which an acoustic velocity of a propagating bulk wave is lower than the acoustic velocity of the acoustic wave which propagates through the piezoelectric layer.

In a case where the IDT electrode of the acoustic wave element is provided on a substrate that has a laminated structure including the piezoelectric layer, the low acoustic velocity film, and the high acoustic velocity support substrate, the Q factor of the acoustic wave element becomes high, and the reflection response thus becomes large. However, an effect is large which reduces or prevents the reflection response at the low frequency end or the high frequency end of the stop band by making the reflector wave length longer than the IDT wave length and by setting the IDT-reflector gap to not more than about 0.45 times the reflector wave length.

Note that herein, "stop band" is defined as a region in which an acoustic wave is trapped in a metal grating with a periodic structure and the wave length of the acoustic wave thus becomes constant.

Further, a frequency of a spurious response that is generated due to the IDT-reflector gap which is not more than about 0.45 times the reflector wave length may be lower than a resonant frequency of an acoustic wave resonator provided with the IDT electrode and the reflector.

Accordingly, the generation frequency of the spurious response is located on a lower frequency side than the resonant frequency of the acoustic wave resonator. Thus, it becomes possible to highly precisely cancel the response characteristics of the reflector by the spurious response.

Further, in a case where the IDT wave length is set as $\lambda_{IDT}$, the IDT-reflector gap is set as IRGAP, and the reflector wave length is set as $\lambda_{REF}$, the IDT-reflector gap and the reflector wave length may satisfy the following expression:

$$1.003170 - 0.130362 \times (IRGAP/\lambda_{REF} - 0.401025) - 0.334499 \times (\lambda_{REF}/\lambda_{IDT} - 1.009606) < 1 \quad \text{expression 1.}$$

The left side of expression 1 is a generation frequency fsp standardized by a resonant frequency fr (fsp/fr), the generation frequency fsp of the spurious response due to reflection between the reflector and the IDT electrode, and is obtained by a numerical analysis. Thus, expression 1 represents generation frequency fsp of spurious response<resonant frequency fr (fsp/fr<1). Accordingly, the generation frequency fsp of the spurious response is located on a lower frequency side than the resonant frequency fr, and it thus becomes possible to highly precisely cancel the response characteristics of the reflector by the spurious response.

Further, the ratio of the IDT-reflector gap to the reflector wave length may be about 0.40 times or greater and about 0.41 times or less than the reflector wave length, and in a case where the IDT wave length is set as $\lambda_{IDT}$, the reflector wave length is set as $\lambda_{REF}$, and a standardized film thickness as a ratio of a film thickness h of the IDT electrode to the IDT wave length is set as $h/\lambda_{IDT}$, $\lambda_{REF}/\lambda_{IDT}$ as a ratio of the reflector wave length to the IDT wave length may be a lower limit value $V_{min}$ or greater and an upper limit value $V_{max}$ or less, the lower limit value $V_{min}$ and the upper limit value $V_{max}$ being provided by the following expressions:

$$V_{min} = 0.0025 \times \frac{h}{\lambda_{IDT}} + 1.0003 \quad \text{expression 2}$$

$$V_{max} = 0.0075 \times \frac{h}{\lambda_{IDT}} + 0.973.$$

Accordingly, because the reflection response at the high frequency end of the stop band may effectively be dispersed, it becomes possible to effectively reduce or prevent an increase in the return loss at the high frequency end of the stop band.

Further, an acoustic wave filter device according to a preferred embodiment of the present invention includes an acoustic wave element according to a preferred embodiment of the present invention.

The acoustic wave filter device includes the acoustic wave element, and deterioration of the insertion loss in a pass band due to the response characteristics of the reflector may thus be reduced or prevented.

Further, the acoustic wave filter device may further include a first input-output terminal and a second input-output terminal; and a parallel arm resonator that is connected with a node and a ground in a route which couples the first input-output terminal and the second input-output terminal together. The acoustic wave element may be a series arm resonator which is connected between the first input-output terminal and the second input-output terminal.

In the above configuration, the acoustic wave filter device defines a ladder acoustic wave filter that includes the series arm resonator and the parallel arm resonator, and an acoustic wave element according to a preferred embodiment of the present invention is used for the series arm resonator. Accordingly, an increase in the insertion loss due to the response characteristics of the reflector may be reduced or prevented on a lower frequency side than a resonant frequency of the series arm resonator that defines a pass band of the acoustic wave filter device.

Further, the acoustic wave filter device may include a first input-output terminal and a second input-output terminal; a series arm resonator that is connected between the first input-output terminal and the second input-output terminal; and a parallel arm resonator that is connected with a node and a ground in a path which couples the first input-output terminal and the second input-output terminal together. The parallel arm resonator may include an acoustic wave element according to a preferred embodiment of the present invention.

In the above configuration, the acoustic wave filter device defines a ladder acoustic wave filter that includes the series arm resonator and the parallel arm resonator, and an acoustic wave element according to a preferred embodiment of the present invention is used for the parallel arm resonator. Accordingly, an increase in the insertion loss due to the response characteristics of the reflector may be reduced or prevented on a higher frequency side than an anti-resonant frequency of the parallel arm resonator that configures the pass band of the acoustic wave filter device.

Further, a multiplexer according to a preferred embodiment of the present invention includes a plurality of filters that include an acoustic wave filter device according to a preferred embodiment of the present invention. One of an input terminal and an output terminal of each of the plurality of filters is directly or indirectly connected with a common terminal and at least one of the plurality of filters except for the acoustic wave filter device has a higher pass band than a frequency of a pass band of the acoustic wave filter device.

Accordingly, in the acoustic wave filter device, because the attenuation in an attenuation band on a higher frequency side than the pass band may be increased, the insertion loss in the pass band of the filter that has a pass band on a higher frequency side than the pass band of the acoustic wave filter device may be reduced.

Acoustic wave elements, acoustic wave filter devices, and multiplexers according to preferred embodiments of the present invention the present invention enable size reduction while reducing or preventing an increase in return loss on a lower frequency side than a resonant frequency of the acoustic wave element or on a higher frequency side than an anti-resonant frequency of the acoustic wave element.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 17A and 17B are graphs that represent the reflection characteristics and the resonance impedance characteristics of the acoustic wave element.

FIGS. 18A and 18B are graphs that represent stopband response intensity and longitudinal mode (in-band) response with respect to the changes in the IDT-reflector gap and reflector wave length/IDT wave length.

DETAILED DESCRIPTION OF THE PREFERRED EMBODIMENTS

Figure 1:
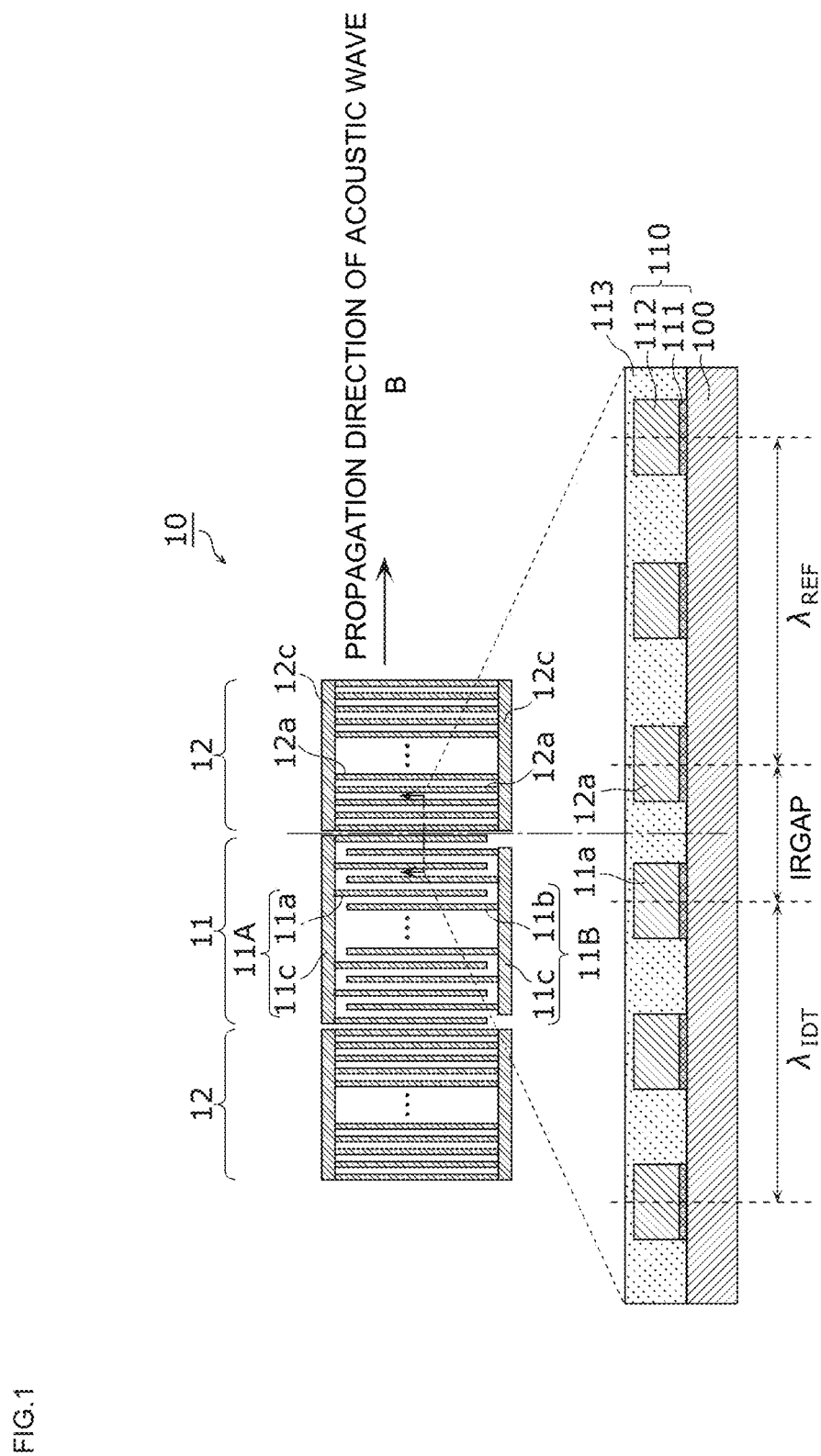
FIG. 1 is a plan view and a cross-sectional view that schematically illustrate an electrode configuration of an acoustic wave element according to a first preferred embodiment of the present invention.

Preferred embodiments of the present invention will hereinafter be described in detail with reference to drawings and tables. Note that all of the preferred embodiments described in the following represent general or specific examples. Values, shapes, materials, elements, arrangement and connection structures of elements, and so forth that are described in the following preferred embodiments are examples and are not intended to limit the scope of the present invention. Further, the elements that are not described in the independent claim among the elements in the following preferred embodiments will be described as arbitrary or optional elements. Further, the sizes or ratios of sizes of the elements illustrated in the drawings are not necessarily strict.

First Preferred Embodiment

The structure of an acoustic wave element 10 according to a first preferred embodiment of the present invention will be described.

FIG. 1 is a plan view and a cross-sectional view that schematically illustrate an electrode configuration of the acoustic wave element 10 according to the first preferred embodiment. The acoustic wave element 10 illustrated in FIG. 1 includes a piezoelectric substrate 100, electrodes 110, and a protection film 113, and an interdigital transducer (IDT) electrode 11 defined thereby and reflectors 12. The acoustic wave element 10 according to the present preferred embodiment is preferably a surface acoustic wave (SAW) resonator that includes the IDT electrode 11, the reflectors 12, and the piezoelectric substrate 100.

Note that the acoustic wave element 10 illustrated in FIG. 1 is for a description of a typical configuration of the acoustic wave element 10, and the number of electrode fingers of the electrode, the length, and the like are not limited to this.

As illustrated in the cross-sectional view of FIG. 1, the electrode 110 of the IDT electrode 11 and the reflector 12 is preferably a laminated structure including a close contact layer 111 and a main electrode layer 112.

The close contact layer 111 improves the close contact between the piezoelectric substrate 100 and the main electrode layer 112, and as a material thereof, Ti is preferably used, for example.

As a material of the main electrode layer 112, Al that contains about 1% Cu is preferably used, for example.

The protection film 113 covers the electrodes 110. The protection film 113 protects the main electrode layers 112 from an external environment, adjusts frequency-temperature characteristics, enhances humidity resistance, and the like and is preferably a film that has silicon dioxide ($SiO_2$) as a main component, for example.

Note that materials used for the close contact layer 111, the main electrode layer 112, and the protection film 113 are not limited to the above-described materials. In addition, the electrode 110 may not be a laminated structure. The electrode 110 may be made of a metal such as Ti, Al, Cu, Pt, Au, Ag, or Pd or an alloy, for example, or may include plural multilayer bodies that include the above metals or alloys. Further, the protection film 113 may not be provided.

The piezoelectric substrate 100 is preferably made of a θ° Y cut X propagation $LiNbO_3$ piezoelectric single crystal or piezoelectric ceramics (a single crystal or ceramics of lithium niobate, which is cut along the plane whose normal line is the axis which is rotated by θ° from the Y axis in the Z-axis direction with the X axis being the central axis and through which a surface acoustic wave propagates in the X-axis direction), for example.

Note that the piezoelectric substrate 100 may be a substrate that has a piezoelectric layer in at least one portion or may be a laminated structure that includes a piezoelectric layer. The piezoelectric substrate 100 may include a high acoustic velocity support substrate, a low acoustic velocity film, and a piezoelectric layer, for example, and may have a structure in which the high acoustic velocity support substrate, the low acoustic velocity film, and the piezoelectric layer are laminated in this order. In the following, a description will be provided of configurations of the high acoustic velocity support substrate, the low acoustic velocity film, and the piezoelectric layer.

The piezoelectric layer is preferably made of a θ° Y cut X propagation $LiNbO_3$ piezoelectric single crystal or piezoelectric ceramics (a single crystal or ceramics of lithium niobate, which is cut along the plane whose normal line is the axis which is rotated by θ° from the Y axis in the Z-axis direction with the X axis being the central axis and through which a surface acoustic wave propagates in the X-axis direction), for example.

The high acoustic velocity support substrate supports the low acoustic velocity film, the piezoelectric layer, and the electrodes 110. In addition, the high acoustic velocity support substrate is a substrate, in which the acoustic velocity of a bulk wave in the high acoustic velocity support substrate becomes higher than that of an acoustic wave as a surface wave or a boundary wave which propagates through the piezoelectric layer, and defines and functions such that a surface acoustic wave is trapped in a portion in which the piezoelectric layer and the low acoustic velocity film are laminated and does not leak to a lower portion than the high acoustic velocity support substrate. The high acoustic velocity support substrate is preferably a silicon substrate, for example. Note that the high acoustic velocity support substrate may be configured with any of (1) a piezoelectric substance such as aluminum nitride, aluminum oxide, silicon carbide, silicon nitride, silicon, sapphire, lithium tantalate, lithium niobate, or quartz, (2) various kinds of ceramics such as alumina, zirconia, cordierite, mullite, steatite, or forsterite, (3) magnesia or diamond, (4) a material that has the above materials as a main component, and (5) a material that has a mixture of the above materials as a main component, for example.

The low acoustic velocity film is a film, in which the acoustic velocity of a bulk wave in the low acoustic velocity film becomes lower than the acoustic velocity of an acoustic wave which propagates through the piezoelectric layer, and is disposed between the piezoelectric layer and the high acoustic velocity support substrate. This structure and the property that the energy of an acoustic wave is fundamentally concentrated into a low acoustic velocity medium reduces or prevents leakage of surface acoustic wave energy to the outside of an IDT electrode. The low acoustic velocity film is preferably a film that has silicon dioxide ($SiO_2$) as a main component, for example.

The laminated structure of the piezoelectric substrate 100 enables large improvements of the Q factor of an acoustic wave resonator at a resonant frequency and an anti-resonant frequency compared to a structure that includes a single layer of the piezoelectric substrate 100. That is, because a surface acoustic wave resonator with a high Q factor may be provided, it becomes possible to provide a filter with small insertion loss by using the surface acoustic wave resonator.

The high acoustic velocity support substrate may have a structure in which a support substrate and a high acoustic velocity film in which the acoustic velocity of a propagating bulk wave becomes higher than that of an acoustic wave as a surface wave or a boundary wave which propagates through the piezoelectric layer are laminated. In this case, for the support substrate, for example, a piezoelectric substance such as sapphire, lithium tantalate, lithium niobate, or quartz, various kinds of ceramics such as alumina, magnesia, silicon nitride, aluminum nitride, silicon carbide, zirconia, cordierite, mullite, steatite, or forsterite, a dielectric such as glass, a semiconductor such as silicon or gallium nitride, a resin substrate, and so forth may preferably be used. Further, for the high acoustic velocity film, for example, various high acoustic velocity materials may preferably be used such as aluminum nitride, aluminum oxide, silicon carbide, silicon nitride, silicon oxynitride, a DLC film, diamond, a medium that has the above material as a main component, and a medium that has a mixture of the above materials as a main component.

Materials of the layers that are exemplified in the laminated structure of the piezoelectric substrate 100 are examples and are changed in accordance with the characteristics considered to be important among the required high frequency propagation characteristics, for example.

As illustrated in the plan view of FIG. 1, the IDT electrode 11 includes a pair of comb-shaped electrodes 11A and 11B that are opposed to each other. The comb-shaped electrode 11A includes plural electrode fingers 11a extending in a direction that intersects with the propagation direction of the acoustic wave and a busbar electrode 11c that connects respective one ends of the plural electrode fingers 11a together. The comb-shaped electrode 11B includes plural electrode fingers 11b extending in a direction that intersects with the propagation direction of the acoustic wave and the busbar electrode 11c that connects respective one ends of the plural electrode fingers 11b together.

The reflector 12 is provided adjacent to the IDT electrode 11 in the propagation direction of the acoustic wave. The reflector 12 includes plural reflector electrode fingers 12a extending in the direction that intersects with the propagation direction of the acoustic wave and busbar electrodes 12c that connect respective one ends of the plural reflector electrode fingers 12a together.

In the acoustic wave element 10 according to the present preferred embodiment, in a boundary region between the IDT electrode 11 and the reflector 12, the IDT-reflector gap (IRGAP) is preferably, for example, not more than about 0.45 times the reflector wave length ($\lambda_{REF}$), and the reflector wave length ($\lambda_{REF}$) is longer than the IDT wave length ($\lambda_{IDT}$).

Figure 2:
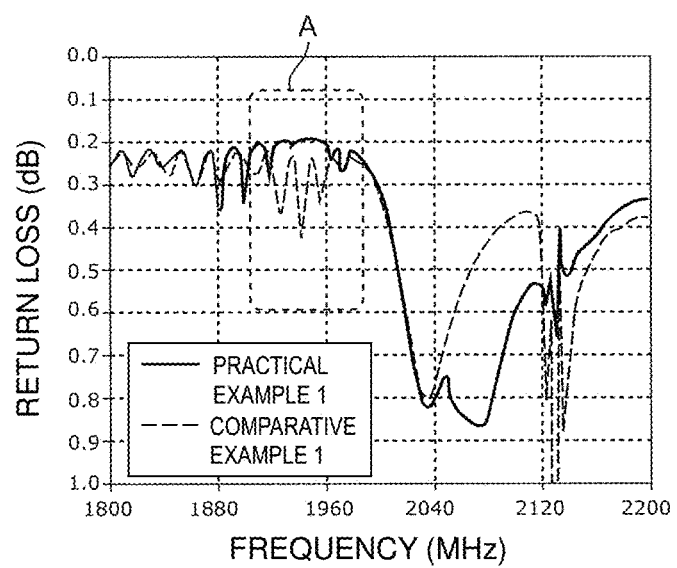
FIG. 2 is a graph that compares reflection characteristics of acoustic wave elements according to a practical example 1 and a comparative example 1.

FIG. 2 is a graph that compares reflection characteristics of acoustic wave filter devices according to a practical example 1 and a comparative example 1. More specifically, FIG. 2 illustrates the return loss in a case where in an acoustic wave element that has the structure illustrated in FIG. 1, a high frequency signal is input from one of (the busbar electrode 11c of) the comb-shaped electrode 11A and (the busbar electrode 11c of) the comb-shaped electrode 11B to the IDT electrode 11. Note that in this case, the other of the comb-shaped electrodes 11A and 11B is in a short-circuited state. Further, Table 1 represents electrode parameters of the acoustic wave elements according to the practical example 1 and the comparative example 1.

TABLE 1

|  | Practical example 1 | Comparative example 1 |
| --- | --- | --- |
| $\lambda_{IDT}$ (µm) | 1.820 | 1.820 |
| $\lambda_{REF}$ (µm) | 1.893 | 1.820 |
| $\lambda_{REF}/\lambda_{IDT}$ | 1.040 | 1.000 |
| Number of pairs in IDT (pairs) | 80 | 80 |
| Intersecting width (µm) | 75.20 | 75.20 |
| Number of pairs in REF (pairs) | 10 | 10 |
| IRGAP (/$\lambda_{REF}$) | 0.4 | 0.5 |

As represented in Table 1, in the acoustic wave element according to the comparative example 1, the IDT-reflector gap (IRGAP) is about 0.5 times the reflector wave length ($\lambda_{REF}$), but in the acoustic wave element according to the practical example 1, the IDT-reflector gap (IRGAP) is about 0.40 times the reflector wave length ($\lambda_{REF}$). In addition, in the acoustic wave element according to the comparative example 1, the reflector wave length ($\lambda_{REF}$) is equal or substantially equal to the IDT wave length ($\lambda_{IDT}$), but in the acoustic wave element according to the practical example 1, the reflector wave length ($\lambda_{REF}$) is about 1.040 times the IDT wave length ($\lambda_{IDT}$). In other words, in the boundary area between the IDT electrode 11 and the reflector 12, the IDT-reflector gap (IRGAP) is not more than about 0.45 times the reflector wave length ($\lambda_{REF}$), and the reflector wave length ($\lambda_{REF}$) is longer than the IDT wave length ($\lambda_{IDT}$).

Accordingly, in the acoustic wave element according to the practical example 1, the IDT-reflector gap (IRGAP) is set to not more than about 0.45 times the reflector wave length ($\lambda_{REF}$), and a spurious response due to reflection in the boundary between the IDT electrode 11 and the reflector 12 is thus generated in a periphery of a low frequency end of a stop band by the reflector 12. In a state where such a spurious response is generated, a generation frequency of the spurious response is shifted to a low frequency side by making the reflector wave length ($\lambda_{REF}$) longer than the IDT wave length ($\lambda_{IDT}$), and it thus becomes possible to cancel, by the spurious response, the response characteristics (return loss ripples) of the reflector 12 in a region (region A in FIG. 2) on a lower frequency side than a resonant frequency fr of an acoustic wave resonator that defines the acoustic wave element. Accordingly, the acoustic wave element according to the practical example 1 reduces the return loss in the region A compared to the acoustic wave element according to the comparative example 1. As represented in Table 1, in both of the acoustic wave elements according to the practical example 1 and the comparative example 1, the number of pairs of electrode fingers of the IDT electrode is 80 pairs, and the number of pairs of electrode fingers is small compared to acoustic wave elements in the related art (related art in Table 2 described later). Thus, even if the number of pairs of electrode fingers of the IDT electrode 11 is decreased, deterioration of the return loss on a lower frequency side than the resonant frequency fr of the acoustic wave resonator is able to be reduced or prevented.

In the following, a detailed description will be provided about the above configuration of the acoustic wave element 10 according to the present preferred embodiment and operations and effects thereof.

Figure 3A:
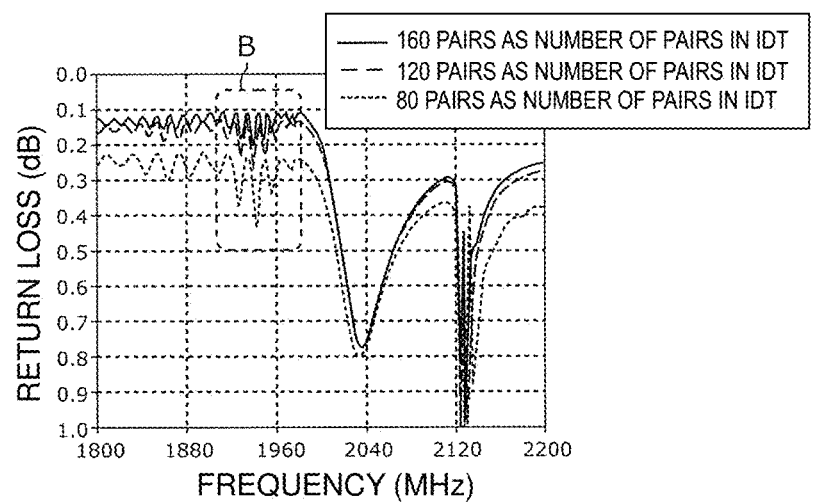
FIG. 3A is a graph that represents the reflection characteristics of acoustic wave elements in the related art.

FIG. 3A is a graph that represents the reflection characteristics of acoustic wave elements in the related art. Further, Table 2 represents electrode parameters of the acoustic wave elements in related art.

TABLE 2

|  | Related art example 1 | Related art example 2 | Related art example 3 |
| --- | --- | --- | --- |
| $\lambda_{IDT}$ (µm) | 1.820 | 1.820 | 1.820 |
| $\lambda_{REF}$ (µm) | 1.820 | 1.820 | 1.820 |
| $\lambda_{REF}/\lambda_{IDT}$ | 1.000 | 1.000 | 1.000 |
| Number of pairs in IDT (pairs) | 160 | 120 | 80 |
| Intersecting width (µm) | 12.53 | 50.13 | 75.20 |
| Number of pairs in REF (pairs) | 10 | 10 | 10 |
| IRGAP (/$\lambda_{REF}$) | 0.5 | 0.5 | 0.5 |

As represented in Table 2, in the acoustic wave elements in the related art (related art example 1 to related art example 3), the IDT-reflector gap (IRGAP) is about 0.5 times the reflector wave length ($\lambda_{REF}$), and the reflector wave length ($\lambda_{REF}$) is equal or substantially equal to the IDT wave length ($\lambda_{IDT}$). In this case, as represented in FIG. 3A, the return loss (return loss ripples) increases due to the response characteristics of the IDT electrode as a reflector on a lower frequency side (region B in FIG. 3A) than the resonant frequency fr of the acoustic wave element. Particularly, as the number of pairs of electrode fingers of the IDT electrode (number of pairs in IDT) is decreased from the related art example 1 to the related art example 3 so as to achieve size reduction, the response characteristics appear more conspicuously, and the return loss increases. Further, in a case where an acoustic wave resonator with a high Q factor is provided by using, as the piezoelectric substrate, the laminated structure that has (1) the θ° Y cut X propagation LiNbO₃ piezoelectric single crystal and (2) the piezoelectric layer, an increase in the return loss (return loss ripples) in the region B becomes conspicuous.

Figure 3B:
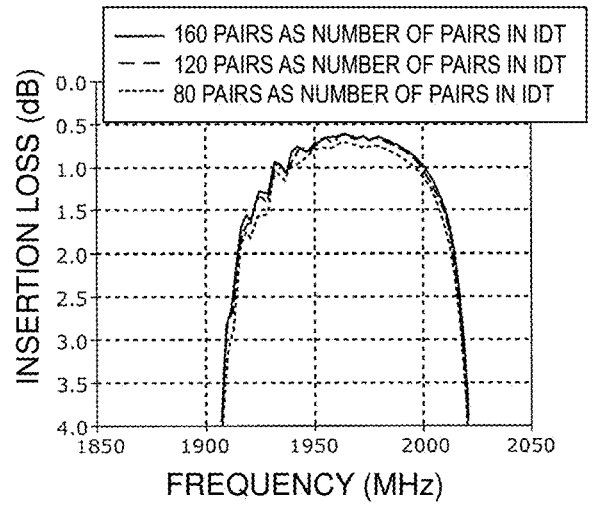
FIG. 3B is a graph that represents bandpass characteristics of acoustic wave filter devices in the related art.

FIG. 3B is a graph that represents the bandpass characteristics of acoustic wave filter devices in the related art. FIG. 3B represents the bandpass characteristics of a ladder filter including four series arm resonators s1 to s4 and three parallel arm resonators p1 to p3. Among those, as the series arm resonator s2, the acoustic wave elements of the related art example 1 to the related art example 3 represented in Table 2 are applied. Table 3 represents electrode parameters of resonators that define the acoustic wave filter devices in the related art.

In the acoustic wave element 10 according to the present preferred embodiment, the first process and second process enable a reduction in the return loss (return loss ripples) in a region on a lower frequency side than the resonant frequency fr. Further, even if the number of pairs of electrode fingers of the IDT electrode 11 is decreased, an increase in the return loss on a lower frequency side than the resonant frequency fr of the acoustic wave resonator is able to be reduced or prevented.

In the following, the first process and second process will be described by indicating the reflection characteristics of acoustic wave elements according to practical examples 2 to 18.

First, a description will be provided about generation conditions of the spurious response that is generated due to reflection between the IDT electrode and the reflector (first process) in order to cancel the response characteristics (hereinafter referred to as reflection response) of the IDT electrode 11 as a reflector in the region on a lower frequency side than the resonant frequency fr of the acoustic wave element.

TABLE 3

| | Series arm resonator s1 | Series arm resonator s2 | Series arm resonator s3 | Series arm resonator s4 | Parallel arm resonator p1 | Parallel arm resonator p2 | Parallel arm resonator p3 |
|---|---|---|---|---|---|---|---|
| $\lambda_{IDT}$ (µm) | 1.844 | Related art example 1 Related art example 2 Related art example 3 | 1.820 | 1.822 | 1.895 | 1.892 | 1.900 |
| $\lambda_{REF}$ (µm) | 1.844 | | 1.820 | 1.822 | 1.895 | 1.892 | 1.900 |
| $\lambda_{REF}/\lambda_{IDT}$ | 1.000 | | 1.000 | 1.000 | 1.000 | 1.000 | 1.000 |
| Number of pairs in IDT (pairs) | 155 | | 115 | 195 | 133 | 136 | 115 |
| Intersecting width (µm) | 14.39 | | 20.18 | 9.27 | 28.84 | 18.80 | 17.34 |
| Number of pairs in REF (pairs) | 10 | | 10 | 10 | 10 | 10 | 10 |
| IRGAP ($/\lambda_{REF}$) | 0.5 | | 0.5 | 0.5 | 0.5 | 0.5 | 0.5 |

When the acoustic wave elements such as the related art example 1 to the related art example 3 are applied as a series arm resonator, as represented in FIG. 3B, deterioration of the insertion loss occurs due to the response characteristics (return loss ripples) of the IDT electrode as a reflector on a low frequency side in a pass band. Further, as the number of pairs of electrode fingers of the IDT electrode (number of pairs in IDT) is decreased, the deterioration of the insertion loss in the pass band increases.

Here, a description will be provided about processes of designing the acoustic wave element 10 according to the present preferred embodiment.

First, the IDT-reflector gap (IRGAP) is set to a shorter interval than an interval among the plural electrode fingers of the IDT electrode 11 and an interval among the electrode fingers of the reflector of the reflector 12, in other words, shorter than about 0.5 times the reflector wave length ($\lambda_{REF}$) (first process).

Accordingly, the spurious response due to reflection in the boundary between the IDT electrode 11 and the reflector 12 is generated in a periphery of the low frequency end of the stop band by the reflector 12.

Next, the reflector wave length ($\lambda_{REF}$) is set longer than the IDT wave length ($\lambda_{IDT}$) (second process).

Accordingly, the generation frequency of a spurious response generated by the first process is shifted to a low frequency side. As a result, the response characteristics (return loss ripples) of the IDT electrode 11 as a reflector in a region on a lower frequency side than the resonant frequency fr of the acoustic wave resonator that defines the acoustic wave element 10 is canceled by the spurious response.

Figure 4:
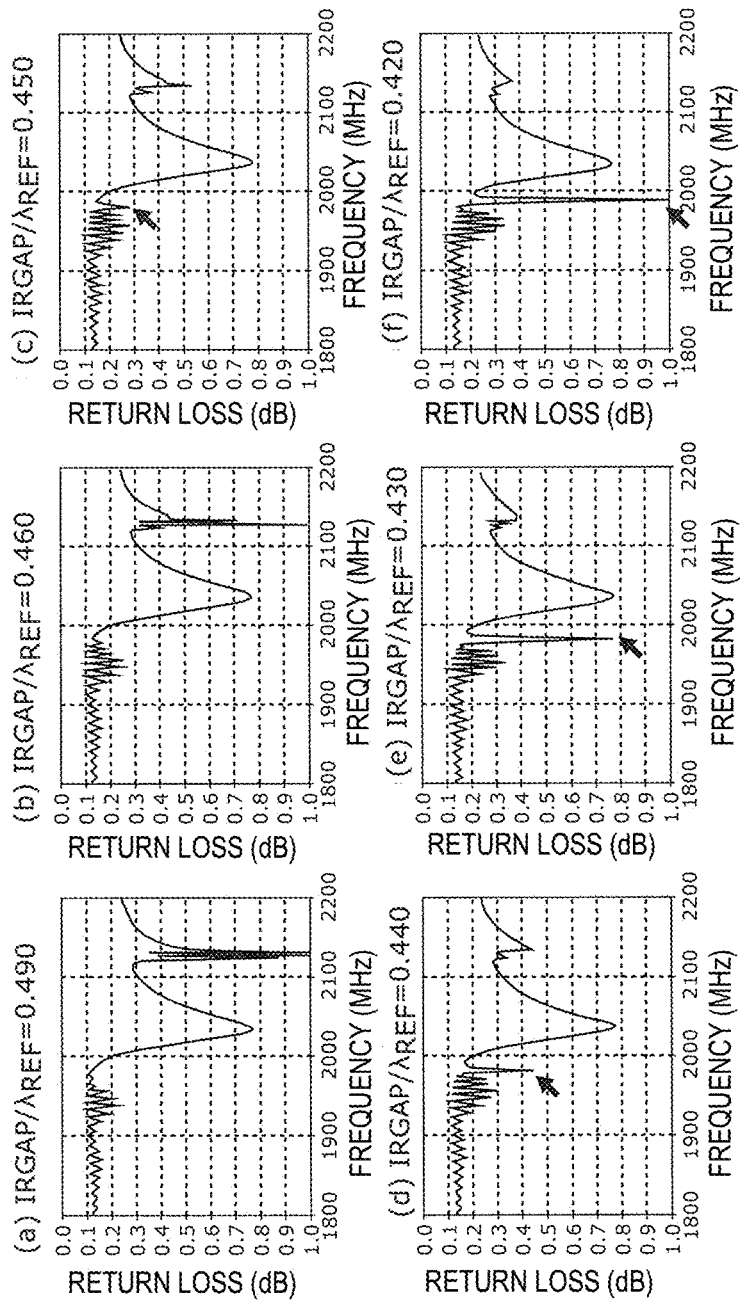
FIG. 4 shows graphs that represent the reflection characteristics of the acoustic wave elements in a case where an IDT-reflector gap is changed.

FIG. 4 is graphs that represent the reflection characteristics of the acoustic wave elements in a case where the IDT-reflector gap is changed. This drawing represents the return loss in a case where the IDT-reflector gap (IRGAP) of the acoustic wave element is set to about 0.490 times to about 0.420 times the reflector wave length ($\lambda_{REF}$). Note that all of the reflector wave lengths ($\lambda_{REF}$) of the acoustic wave elements that have the reflection characteristics represented in (a) to (f) of FIG. 4 are set equal or substantially equal to the IDT wave length ($\lambda_{IDT}$).

As represented in FIG. 4, the IDT-reflector gap (IRGAP) is set shorter than about 0.450 times the reflector wave length ($\lambda_{REF}$), and the spurious response generated due to reflection between the IDT electrode and the reflector (local minimum points indicated by arrows in (c) to (f) of FIG. 4: hereinafter referred to as IR spurious response) is thus generated. Further, the return loss of this IR spurious response increases as the IDT-reflector gap (IRGAP) decreases.

Next, a description will be provided about conditions under which the reflector wave length ($\lambda_{REF}$) is set longer than the IDT wave length ($\lambda_{IDT}$) with respect to the IR spurious response generated by adjusting the IDT-reflector gap (IRGAP) (second process) and the reflection response is thus canceled.

Figure 5A:
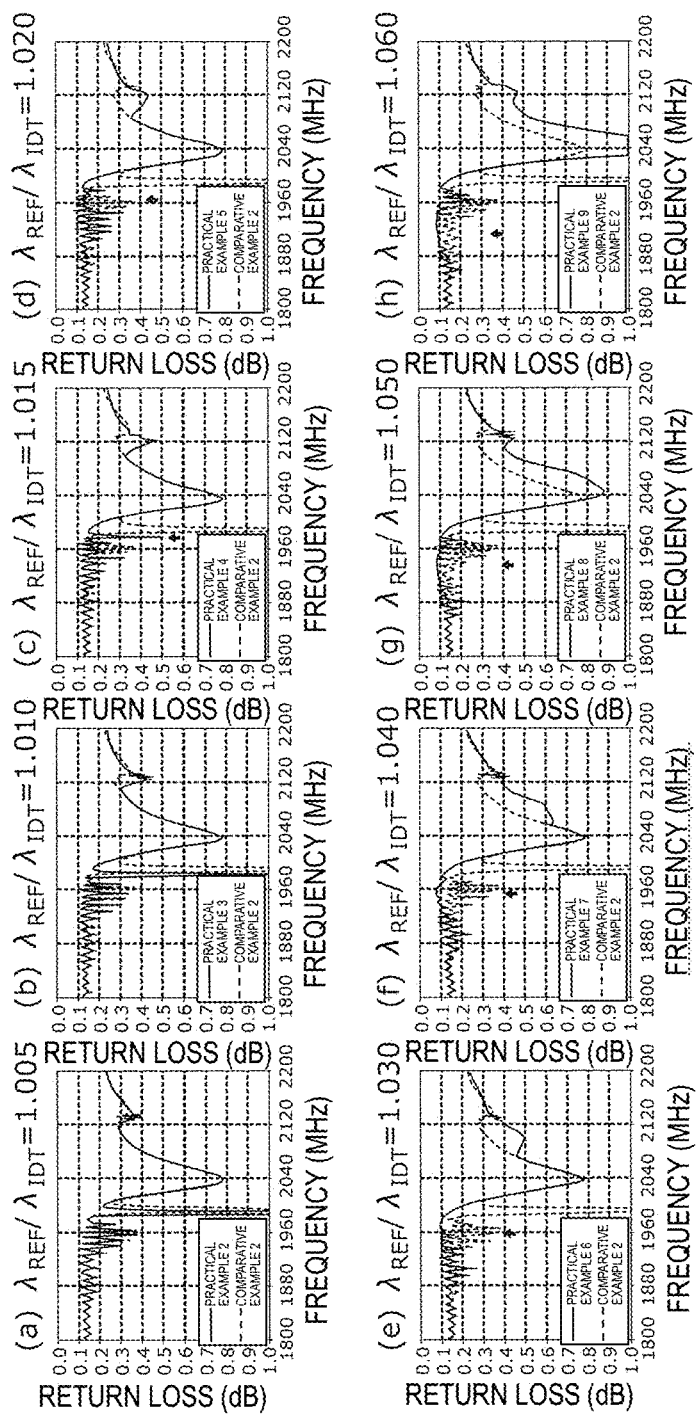
FIG. 5A shows graphs that compare the reflection characteristics of acoustic wave elements according to practical examples and a comparative example in a case where a reflector wave length is changed (in a case where the IDT-reflector gap is about 0.400 times a reflector wave length).
Figure 5B:
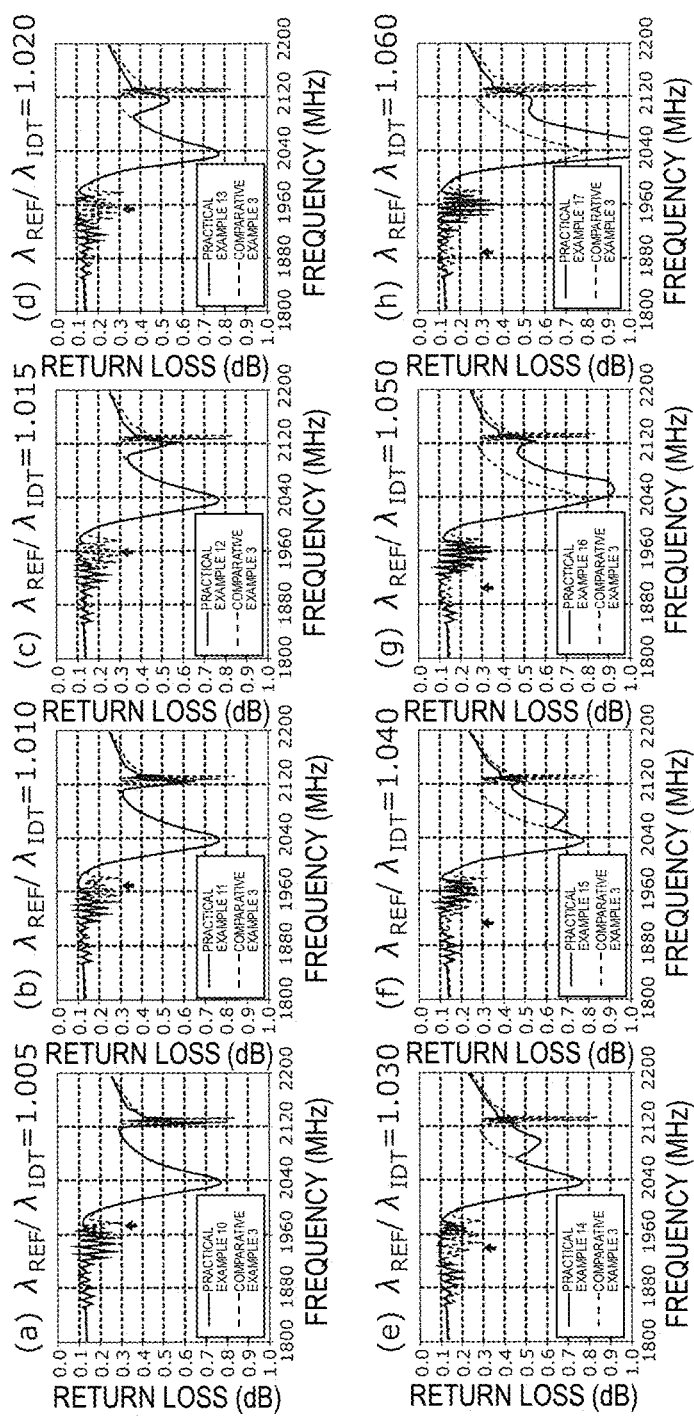
FIG. 5B are graphs that compare the reflection characteristics of acoustic wave elements according to practical examples and a comparative example in a case where the reflector wave length is changed (in a case where the IDT-reflector gap is about 0.450 times the reflector wave length).

FIGS. 5A and 5B are graphs that compare the reflection characteristics of acoustic wave elements according to the practical examples and comparative examples in a case where the reflector wave length ($\lambda_{REF}$) is changed. FIG. 5A represents a case where the IDT-reflector gap (IRGAP) is about 0.400 times the reflector wave length ($\lambda_{REF}$), and FIG.

Figure 5C:
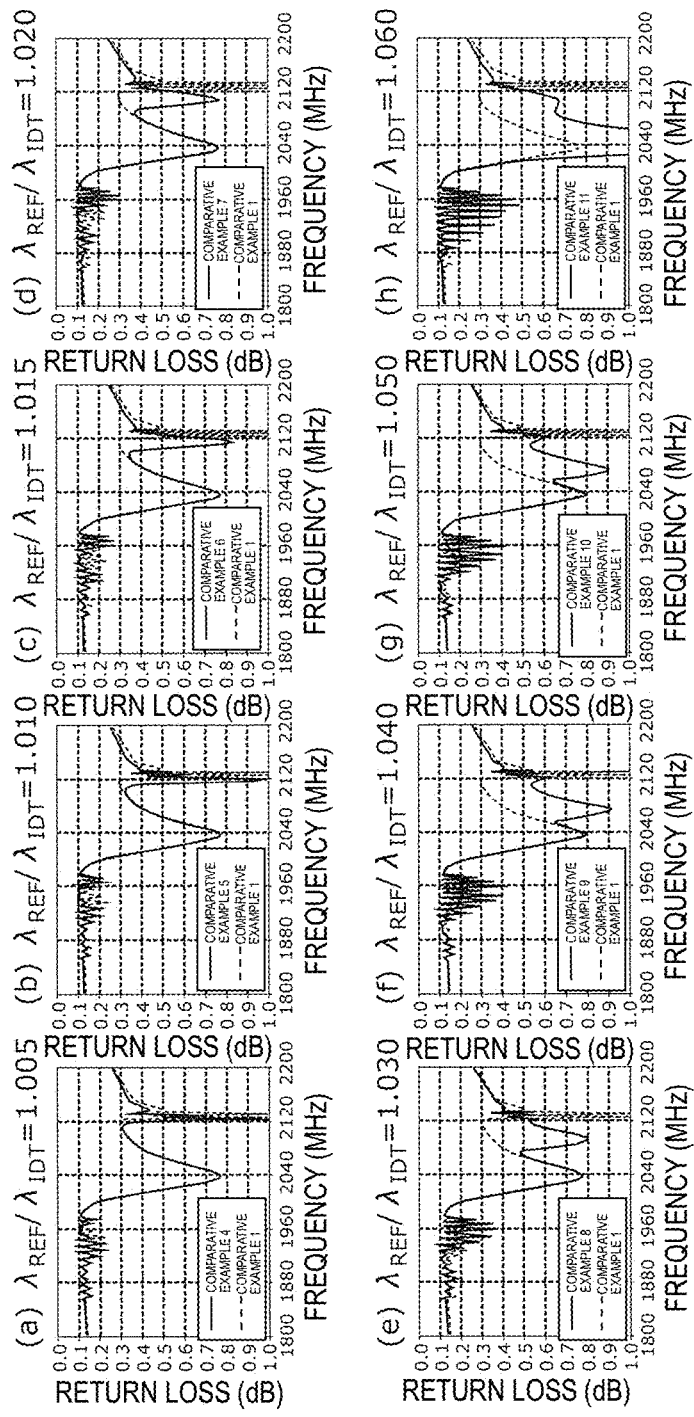
FIG. 5C shows graphs that compare the reflection characteristics of acoustic wave elements according to comparative examples in a case where the reflector wave length is changed (in a case where the IDT-reflector gap is about 0.500 times the reflector wave length).

5B represents a case where the IDT-reflector gap (IRGAP) is about 0.450 times the reflector wave length ($\lambda_{REF}$). Further, FIG. 5C includes graphs that compare the reflection characteristics of acoustic wave elements according to comparative examples in a case where the reflector wave length ($\lambda_{REF}$) is changed. Note that FIG. 5C represents a case where the IDT-reflector gap (IRGAP) is about 0.500 times the reflector wave length ($\lambda_{REF}$). Further, Table 4 collectively represents the IDT-reflector gaps (IRGAP) and the reflector wave lengths ($\lambda_{REF}$) of a practical example 1 to a practical example 18 and a comparative example 1 to a comparative example 11.

On the other hand, as represented in FIG. 5C, in a case where the IDT-reflector gap (IRGAP) is about 0.500 times the reflector wave length ($\lambda_{REF}$), the IR spurious response is not generated even if the reflector wave length ($\lambda_{REF}$) is increased from about 1.005 times the IDT wave length ($\lambda_{IDT}$). Thus, the reflection response is not reduced on a lower frequency side than the resonant frequency of the acoustic wave element, but the reflection response increases as the reflector wave length ($\lambda_{REF}$) is increased.

As also represented in FIG. 4, this is due to a fact that a significant IR spurious response is not generated in a case

TABLE 4

|  | IRGAP ($/\lambda_{REF}$) | $\lambda_{REF}$ ($/\lambda_{IDT}$) |  | IRGAP ($/\lambda_{REF}$) | $\lambda_{REF}$ ($/\lambda_{IDT}$) |
|---|---|---|---|---|---|
| Practical example 1 | 0.400 | 1.040 | Comparative example 1 | 0.500 | 1.000 |
| Practical example 2 | 0.400 | 1.005 | Comparative example 2 | 0.400 | 1.000 |
| Practical example 3 | 0.400 | 1.010 | Comparative example 3 | 0.450 | 1.000 |
| Practical example 4 | 0.400 | 1.015 | Comparative example 4 | 0.500 | 1.005 |
| Practical example 5 | 0.400 | 1.020 | Comparative example 5 | 0.500 | 1.010 |
| Practical example 6 | 0.400 | 1.030 | Comparative example 6 | 0.500 | 1.015 |
| Practical example 7 | 0.400 | 1.040 | Comparative example 7 | 0.500 | 1.020 |
| Practical example 8 | 0.400 | 1.050 | Comparative example 8 | 0.500 | 1.030 |
| Practical example 9 | 0.400 | 1.060 | Comparative example 9 | 0.500 | 1.040 |
| Practical example 10 | 0.450 | 1.005 | Comparative example 10 | 0.500 | 1.050 |
| Practical example 11 | 0.450 | 1.010 | Comparative example 11 | 0.500 | 1.060 |
| Practical example 12 | 0.450 | 1.015 |  |  |  |
| Practical example 13 | 0.450 | 1.020 |  |  |  |
| Practical example 14 | 0.450 | 1.030 |  |  |  |
| Practical example 15 | 0.450 | 1.040 |  |  |  |
| Practical example 16 | 0.450 | 1.050 |  |  |  |
| Practical example 17 | 0.450 | 1.060 |  |  |  |
| Practical example 18 | 0.420 | 1.035 |  |  |  |

As represented in FIG. 5B, in a case where the IDT-reflector gap (IRGAP) is about 0.450 times the reflector wave length ($\lambda_{REF}$), as the reflector wave length ($\lambda_{REF}$) is increased from about 1.005 times the IDT wave length ($\lambda_{IDT}$), the generation frequency of the IR spurious response (arrow portions indicated in FIG. 5B) is shifted to the low frequency side. Further, particularly in a case where the reflector wave length ($\lambda_{REF}$) is set to about 1.020 times the IDT wave length ($\lambda_{IDT}$), an IR spurious response generation frequency (fsp) is positioned on a lower frequency side than the point of the resonant frequency (fr: about 1977.72 MHz in FIG. 5B) of the acoustic wave element. In this case, it is understood that the IR spurious response may more effectively cancel the reflection response and the return loss is alleviated in a wide band on a lower frequency side than the resonant frequency of the acoustic wave element.

As represented in FIG. 5A, in a case where the IDT-reflector gap (IRGAP) is about 0.400 times the reflector wave length ($\lambda_{REF}$), as the reflector wave length ($\lambda_{REF}$) is increased from about 1.005 times the IDT wave length ($\lambda_{IDT}$), the generation frequency of the IR spurious response (arrow portions indicated in FIG. 5A) is shifted to the low frequency side. Further, particularly in a case where the reflector wave length ($\lambda_{REF}$) is set to not less than about 1.040 times the IDT wave length ($\lambda_{IDT}$), the IR spurious response generation frequency (fsp) is positioned on a lower frequency side than the point of the resonant frequency (fr: about 1977.72 MHz in FIG. 5A) of the acoustic wave element. In this case, it is understood that the IR spurious response may more effectively cancel the reflection response and the return loss is alleviated in a wide band on a lower frequency side than the resonant frequency of the acoustic wave element.

where the IDT-reflector gap (IRGAP) is not less than about 0.460 times the reflector wave length ($\lambda_{REF}$).

From the results in FIGS. 4, 5A, and 5B, the conditions under which the return loss is alleviated on a lower frequency side than the resonant frequency fr of the acoustic wave element 10 according to the present preferred embodiment are (1) the IDT-reflector gap (IRGAP) that is not more than about 0.45 times the reflector wave length ($\lambda_{REF}$) and (2) the reflector wave length ($\lambda_{REF}$) that is longer than the IDT wave length ($\lambda_{IDT}$).

Figure 6:
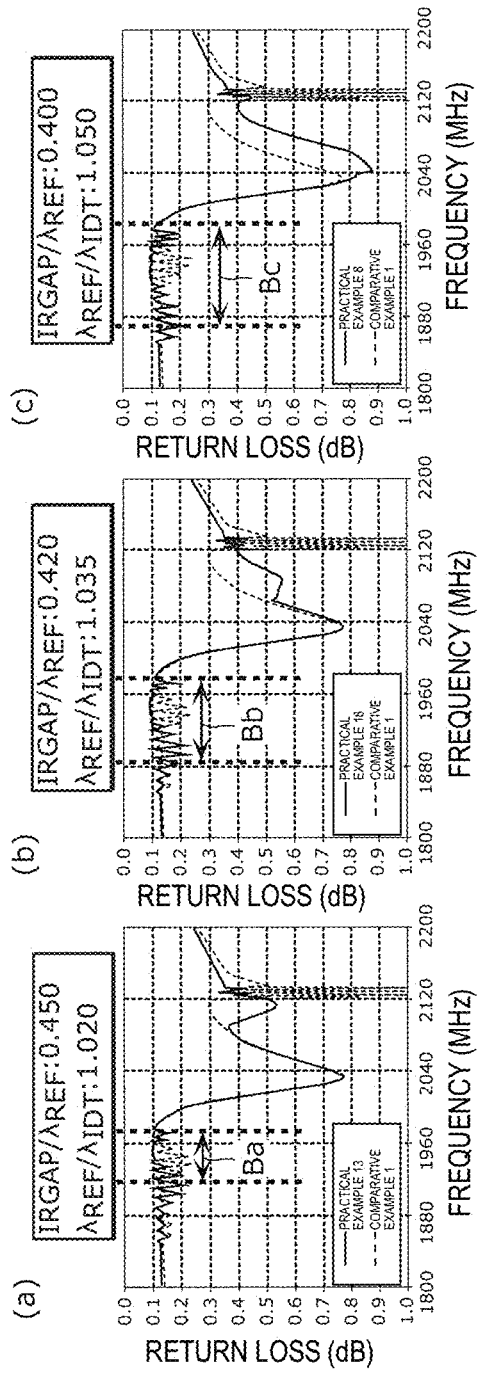
FIG. 6 shows graphs that represent the reflection characteristics of the optimal acoustic wave elements in cases where the IDT-reflector gaps are about 0.450 times, about 0.420 times, and about 0.400 times the reflector wave length.

FIG. 6 is graphs that represent the reflection characteristics of the optimal acoustic wave elements 10 in cases where the IDT-reflector gaps (IRGAP) are about 0.450 times, about 0.420 times, and about 0.400 times the reflector wave length ($\lambda_{REF}$). (a) of FIG. 6 represents that in a case where IRGAP/$\lambda_{REF}$=about 0.450, the reduction in the reflection response is optimized in a case where $\lambda_{REF}/\lambda_{IDT}$=about 1.020. Further, (b) of FIG. 6 represents that in a case where IRGAP/$\lambda_{REF}$=about 0.420, the reduction in the reflection response is optimized in a case where $\lambda_{REF}/\lambda_{IDT}$=about 1.035. Further, (c) of FIG. 6 represents that in a case where IRGAP/$\lambda_{REF}$=about 0.400, the reduction in the reflection response is optimized in a case where $\lambda_{REF}/\lambda_{IDT}$=about 1.050.

In (a) of FIG. 6, it is understood that the return loss is alleviated in a band Ba on a lower frequency side than the resonant frequency fr of the acoustic wave element 10. Further, in (b) of FIG. 6, it is understood that the return loss is alleviated in a band Bb on a lower frequency side than the resonant frequency fr of the acoustic wave element 10. Further, in (c) of FIG. 6, it is understood that the return loss is alleviated in a band Bc on a lower frequency side than the resonant frequency fr of the acoustic wave element 10. Note that as IRGAP/$\lambda_{REF}$ decreases from about 0.450 as an upper limit value, the band in which the return loss is alleviated becomes wider (from Ba to Bc).

Figure 21:
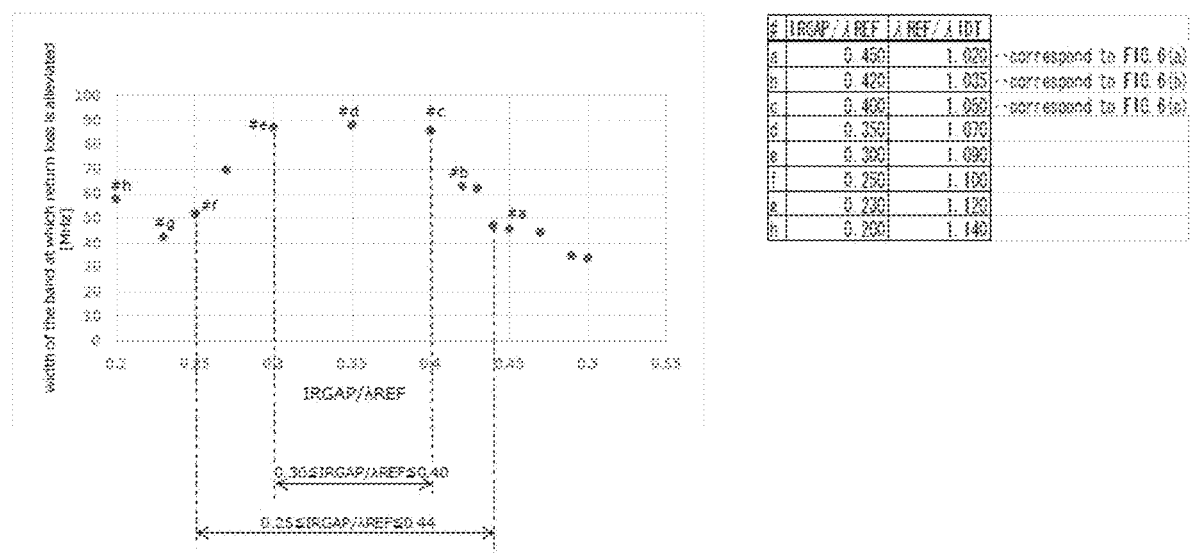
FIG. 21 is a graph that represents a width of the band at which return loss is alleviated in a case where IDT-reflector gap/reflector wave length is changed.

FIG. 21 is a graph that represents the width of the band at which return loss is alleviated in a case where IRGAP/$\lambda_{REF}$ is changed. In FIG. 21, example #a corresponds to the representation shown in (a) of FIG. 6, example #b corresponds to the representation shown in (b) of FIG. 6, and example #c corresponds to the representation shown in (c) of FIG. 6. Further, in FIG. 21, it is understood that the width of the band at which return loss is alleviated is optimized in a case where 0.25≤IRGAP/$\lambda_{REF}$≤0.44, and more preferably in a case where 0.30≤IRGAP/$\lambda_{REF}$≤0.40.

In the following, a description will be provided about more preferable combinations in which the return loss is alleviated (IRGAP/$\lambda_{REF}$ and $\lambda_{REF}$/$\lambda_{IDT}$).

Figure 7:
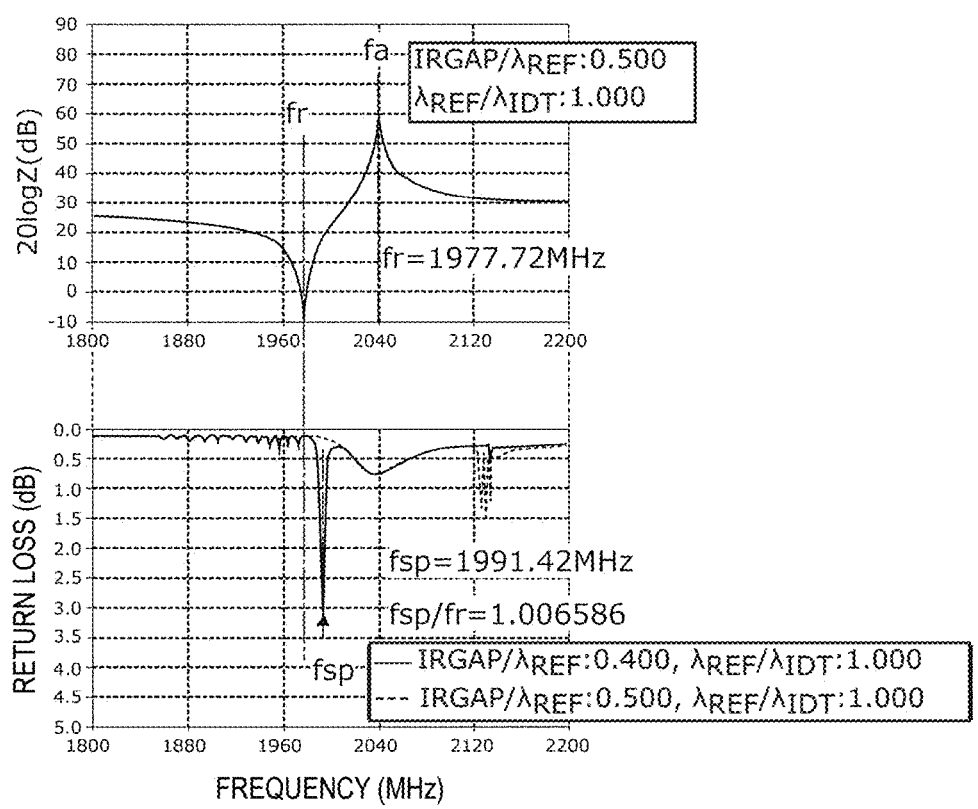
FIG. 7 is a graph that represents the relationship between impedance characteristics and the reflection characteristics of the acoustic wave element.

FIG. 7 is a graph that represents the relationship between the resonant impedance characteristics and the reflection characteristics of the acoustic wave element. The upper stage of FIG. 7 represents the impedance characteristics of the acoustic wave resonator in a case where IRGAP/$\lambda_{REF}$=about 0.500 and $\lambda_{REF}$/$\lambda_{IDT}$=about 1.000 (comparative example 1), and the lower stage of FIG. 7 represents the reflection characteristics of the acoustic wave elements in a case where IRGAP/$\lambda_{REF}$=about 0.400 and $\lambda_{REF}$/$\lambda_{IDT}$=about 1.000 (comparative example 2) and in a case where IRGAP/$\lambda_{REF}$=about 0.500 and $\lambda_{REF}$/$\lambda_{IDT}$=about 1.000 (comparative example 1).

In the impedance characteristics represented in the upper stage of FIG. 7, the resonant frequency fr at which the impedance becomes a local minimum value and an anti-resonant frequency fa at which the impedance becomes a local maximum value are indicated, and in the acoustic wave element according to the comparative example 1, fr=about 1977.72 MHz, for example. On the other hand, in the reflection characteristics represented in the lower stage of FIG. 7, in the acoustic wave element according to the comparative example 2, the IR spurious response is generated at spurious response generation frequency fsp=about 1991.42 MHz.

Here, the reflection response is generated on a lower frequency side than the resonant frequency fr of the acoustic wave resonator. Thus, as a condition to reduce the return loss by reducing the reflection response, the spurious response generation frequency fsp is preferably set to the resonant frequency fr or lower, and the condition is represented by the following formula 1.

$$\frac{f_{sp}}{fr} < 1 \qquad \text{(Formula 1)}$$

The relationship of the formula 1 is satisfied, and the generation frequency fsp of the IR spurious response is thus located on a lower frequency side than the resonant frequency fr of the acoustic wave resonator. Thus, it becomes possible to highly precisely cancel the reflection response by the IR spurious response.

Here, the inventors of preferred embodiments of the present invention have performed a numerical analysis for the spurious response generation frequencies fsp that occur in practical examples 1 to 18, comparative examples 1 to 11, which are represented in Table 4, and so forth and have thus discovered that the spurious response generation frequency (fsp/fr) that is represented by formula 1 and is standardized by the resonant frequency fr is expressed as formula 2 by using IRGAP/$\lambda_{REF}$ and $\lambda_{REF}$/$\lambda_{IDT}$.

$$\frac{f_{sp}}{fr} = 1.003170 - 0.130362 \times (IRGAP/\lambda_{ref} - 0.401025) - \qquad \text{(Formula 2)}$$
$$0.334499 \times (\lambda_{REF}/\lambda_{IDT} - 1.009606)$$

Formula 3 is derived from the formula 1 and formula 2.

$$1.003170 - 0.130362 \times (IRGAP/\lambda_{REF} - 0.401025) - $$
$$0.334499 \times (\lambda_{REF}/\lambda_{IDT} - 1.009606) < 1 \qquad \text{(Formula 3)}$$

The combination (IRGAP/$\lambda_{REF}$ and $\lambda_{REF}$/$\lambda_{IDT}$) to locate the IR spurious response on a lower frequency side than the resonant frequency fr is obtained by the formula 3. It becomes possible to highly precisely cancel the reflection response by the IR spurious response by using this combination.

Here, a description will be provided about effects of reducing the number of pairs of reflector electrode fingers included in the reflector. Note that in the following, the number of pairs of reflector electrode fingers included in the reflector will be referred to as the number of pairs in the reflector. As for the number of pairs in the reflector, two reflector electrode fingers 12a that are adjacent to each other in the reflector 12 illustrated in FIG. 1 are defined as one pair.

Figure 8:
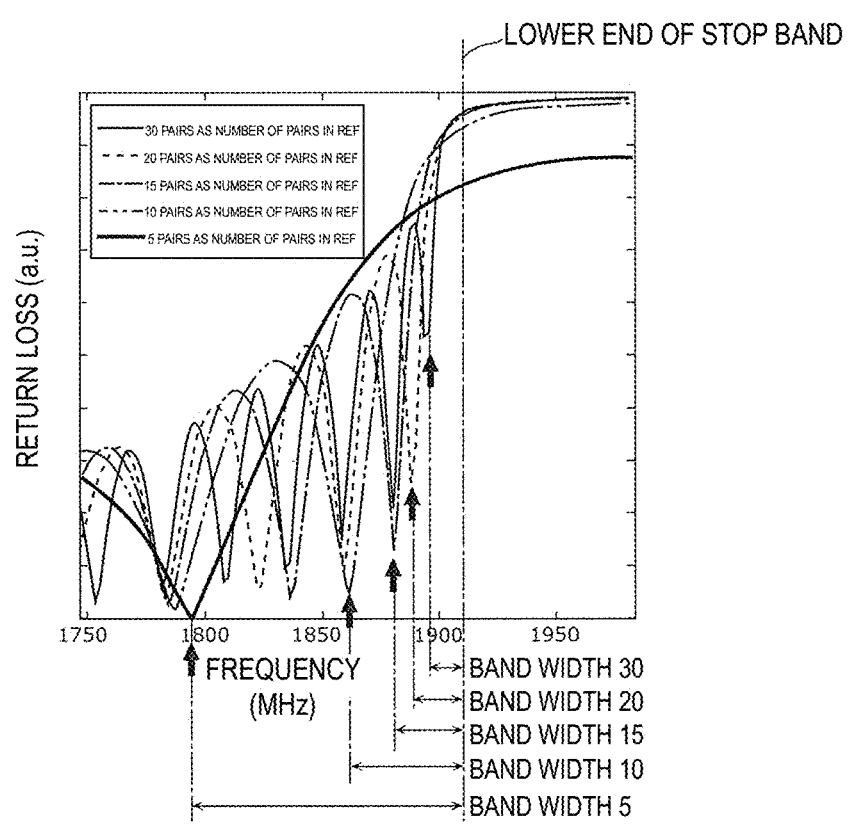
FIG. 8 is a graph that represents band widths in which the reflection characteristics of the acoustic wave element may be improved by generation of a spurious response.

FIG. 8 is a graph that represents band widths in which reflection response characteristics of the acoustic wave element may be improved by generation of the IR spurious response. This drawing represents the return loss in a region on a lower frequency side than the resonant frequency fr of the acoustic wave element and represents the changes in the reflection characteristics in a case where the number of pairs in the reflector are changed from 30 pairs to 5 pairs. Here, as represented in FIG. 8, the interval (band width) between the low frequency end (lower end) of the stop band and local maximum values of the return loss, which are closest to the low frequency end, becomes wider as the number of pairs in the reflector becomes smaller. Because this band width becomes the band in which the reflection response may effectively be canceled by the IR spurious response, it is understood that the reflection response may be reduced in a wider band as the number of pairs in the reflector becomes smaller.

Figure 9:
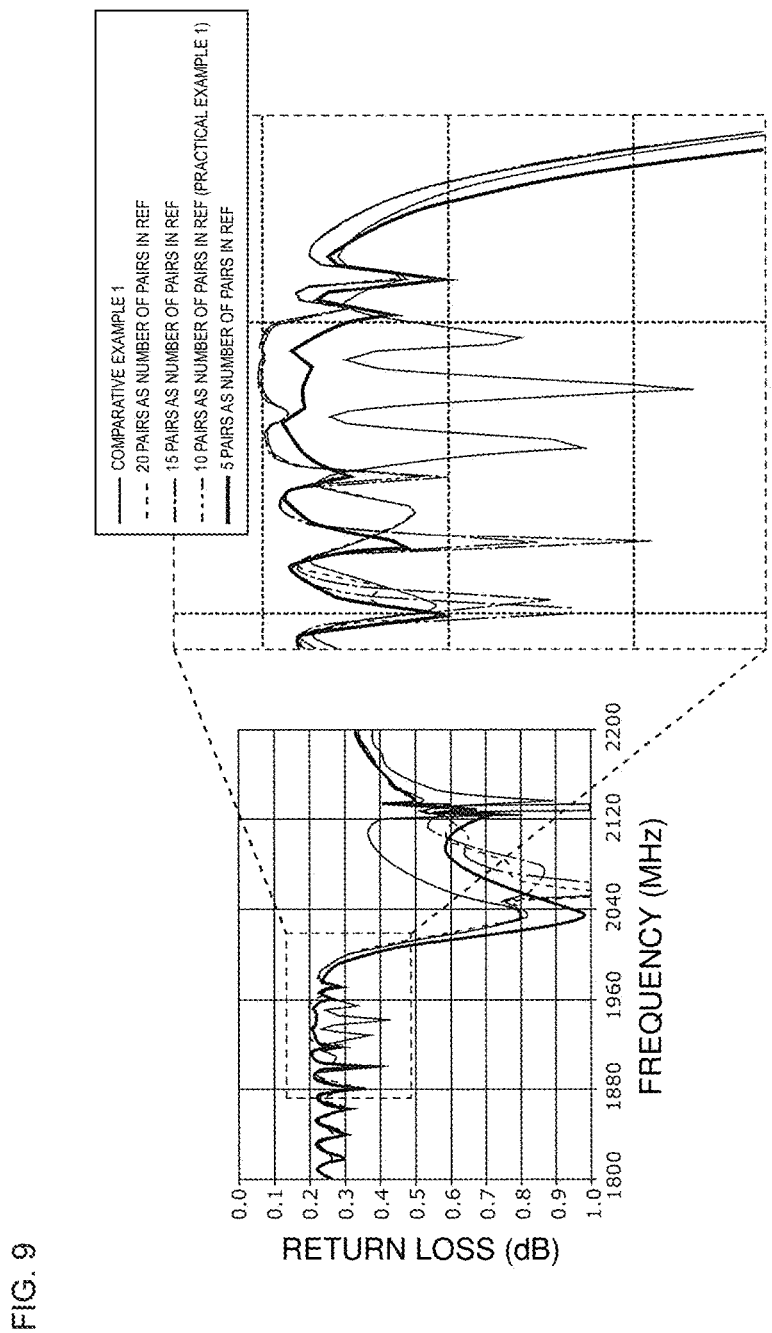
FIG. 9 is a graph that represents the changes in the reflection characteristics of the acoustic wave elements in a case where the number of pairs of electrode fingers of the reflector is changed.

FIG. 9 is a graph that represents the changes in the reflection characteristics of the acoustic wave elements in a case where the number of pairs of electrode fingers of the reflector is changed. The left side of FIG. 9 represents the reflection characteristics of the acoustic wave element 10 according to the practical example 1 (10 pairs as the number of pairs in the reflector), the acoustic wave elements 10 in which the number of pairs in the reflector of the practical example 1 is set to 20 pairs, 15 pairs, 10 pairs, and 5 pairs, and the acoustic wave element according to the comparative example 1 (10 pairs as the number of pairs in the reflector). Further, the right side of FIG. 9 represents the reflection characteristics of the plural acoustic wave elements in a region on a lower frequency side than the resonant frequency fr, which are enlarged.

As represented in FIG. 9, it is understood that the reflection response may be reduced in a wider band as the number of pairs in the reflector becomes smaller. Particularly, when the number of pairs in the reflector is set to 15 pairs or less, the band in which the return loss due to the reflection response is able to be reduced may be made wider compared to comparative example 1.

Second Preferred Embodiment

In a second preferred embodiment of the present invention, a description will be provided about an acoustic wave filter device that uses the acoustic wave element 10 according to the first preferred embodiment. An acoustic wave filter device includes the acoustic wave element 10 according to the first preferred embodiment, and deterioration of the insertion loss in a pass band due to the response characteristics (reflection response) of the IDT electrode as a reflector is thus reduced or prevented.

In the present preferred embodiment, a description will be provided of a ladder acoustic wave filter that includes the acoustic wave element 10 according to the first preferred embodiment as a series arm resonator.

First, a description will be provided about a basic action principle of a ladder acoustic wave filter that includes a series arm resonator and a parallel arm resonator. A parallel arm resonator has a resonant frequency frp at which an impedance |Z| becomes a local minimum and an anti-resonant frequency fap (>frp) at which the impedance |Z| becomes a local maximum. Further, a series arm resonator has a resonant frequency frs at which the impedance |Z| becomes a local minimum and an anti-resonant frequency fas (>frs>frp) at which the impedance |Z| becomes a local maximum. When a band pass filter includes ladder resonators, the anti-resonant frequency fap of the parallel arm resonator and the resonant frequency frs of the series arm resonator are closely positioned. Accordingly, the vicinity of the resonant frequency frp at which the impedance of the parallel arm resonator approaches zero becomes a stop band on a low frequency side. Further, when the frequency becomes higher than the vicinity of the resonant frequency frp, the impedance of the parallel arm resonator becomes high in the vicinity of the anti-resonant frequency fap, and the impedance of the series arm resonator approaches zero in the vicinity of the resonant frequency frs. Accordingly, the vicinity of the anti-resonant frequency fap to the vicinity of the resonant frequency frs becomes a signal pass band. In addition, when the frequency becomes high and approaches the vicinity of the anti-resonant frequency fas, the impedance of the series arm resonator becomes high, and the vicinity of the anti-resonant frequency fas becomes a stop band on a high frequency side. In other words, the pass band is defined by the anti-resonant frequency fap of the parallel arm resonator and the resonant frequency frs of the series arm resonator, an attenuation pole on a low band side of the pass band is defined by the resonant frequency frp of the parallel arm resonator, and an attenuation pole on a high band side of the pass band is defined by the anti-resonant frequency fas of the series arm resonator.

Figure 10:
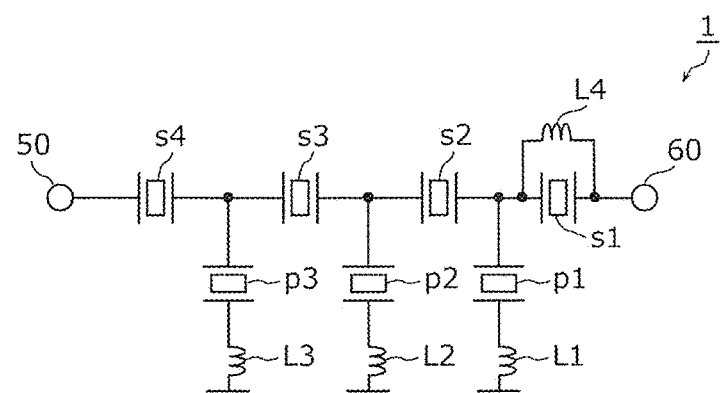
FIG. 10 is a diagram that illustrates a circuit configuration of an acoustic wave filter device according to a second preferred embodiment of the present invention.

FIG. 10 is a diagram that illustrates a circuit configuration of an acoustic wave filter 1 according to a second preferred embodiment of the present invention. As illustrated in FIG. 10, the acoustic wave filter 1 includes series arm resonators s1 to s4, parallel arm resonators p1 to p3, inductors L1 to L4, and input-output terminals 50 and 60.

The series arm resonators s1 to s4 are connected in series with each other between the input-output terminal 50 and the input-output terminal 60. Further, the parallel arm resonators p1 to p3 are connected in parallel with each other between the connection points, at which the input-output terminals 50 and 60 and the series arm resonators s1 to s4 are respectively connected together, and reference terminals (grounds). In the above connection configuration of the series arm resonators s1 to s4 and the parallel arm resonators p1 to p3, the acoustic wave filter 1 defines a ladder band pass filter. Further, the inductor L1 is connected between the parallel arm resonator p1 and the ground, the inductor L2 is connected between the parallel arm resonator p2 and the ground, the inductor L3 is connected between the parallel arm resonator p3 and the ground, and the inductor L4 is connected in parallel with the series arm resonator s1. Note that it is sufficient that the acoustic wave filter device according to preferred embodiments of the present invention has a configuration that includes the configuration of the acoustic wave element 10 according to the first preferred embodiment. The circuit configuration illustrated in FIG. 10 is one example thereof, but the number of series arm resonators, the number of parallel arm resonators, connection positions of the inductors, and so forth are not limited to the configuration of FIG. 10. Further, FIG. 10 exemplifies a ladder circuit configuration, but a longitudinally coupled resonant circuit may be included.

Table 5 represents electrode parameters of the resonators of the acoustic wave filter 1 according to the second preferred embodiment (practical example). Further, Table 5 represents, in parentheses, electrode parameters of resonators of an acoustic wave filter according to a comparative example, as the differences from the acoustic wave filter according to the practical example.

TABLE 5

| Practical example (Comparative example) | Series arm resonator s1 | Series arm resonator s2 | Series arm resonator s3 | Series arm resonator s4 | Parallel arm resonator p1 | Parallel arm resonator p2 | Parallel arm resonator p3 |
|---|---|---|---|---|---|---|---|
| $\lambda_{IDT}$ (μm) | 1.844 | 1.820 | 1.820 | 1.822 | 1.895 | 1.892 | 1.900 |
| $\lambda_{REF}$ (μm) | 1.918 (1.844) | 1.893 (1.820) | 1.893 (1.820) | 1.895 (1.822) | 1.895 | 1.892 | 1.900 |
| $\lambda_{REF}/\lambda_{IDT}$ | 1.040 (1.000) | 1.040 (1.000) | 1.040 (1.000) | 1.040 (1.000) | 1.000 | 1.000 | 1.000 |
| Number of pairs in IDT (pairs) | 155 | 160 | 115 | 195 | 133 | 136 | 115 |
| Intersecting width (μm) | 14.39 | 12.53 | 20.18 | 9.27 | 28.84 | 18.80 | 17.34 |
| Number of pairs in REF (pairs) | 10 | 10 | 10 | 10 | 10 | 10 | 10 |
| IRGAP ($/\lambda_{REF}$) | 0.4 (0.5) | 0.4 (0.5) | 0.4 (0.5) | 0.4 (0.5) | 0.5 | 0.5 | 0.5 |

As represented in Table 5, in the acoustic wave filter 1 according to the second preferred embodiment (practical example), the acoustic wave element 10 according to the first preferred embodiment is used for the series arm resonators s1 to s4.

Figure 11:
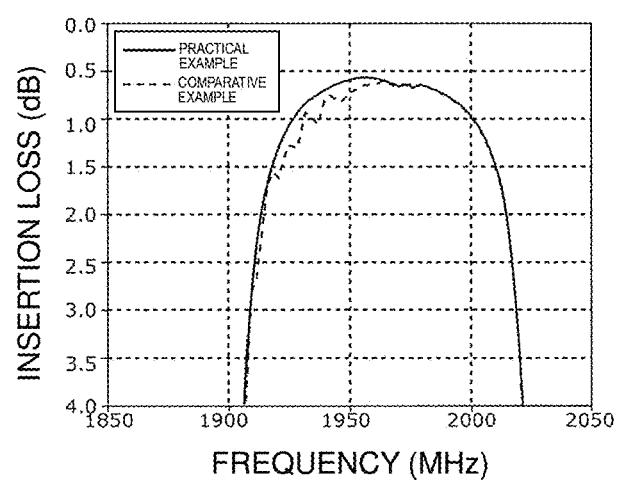
FIG. 11 is a graph that compares the bandpass characteristics of acoustic wave filter devices according to the second preferred embodiment of the present invention and a comparative example.

FIG. 11 is a graph that compares the bandpass characteristics of the acoustic wave filters according to the second preferred embodiment (practical example) and the comparative example.

In the acoustic wave filter 1 according to the present preferred embodiment, the acoustic wave element according to the first preferred embodiment is used for the series arm resonators, and the return loss of the series arm resonators may thus be reduced in a pass band on a lower frequency side than the resonant frequency frs of the series arm resonators, in other words, in a pass band on a lower band side than an approximate center frequency of the pass band. Thus, as represented in FIG. 11, the acoustic wave filter 1 according to the practical example is capable of reducing the insertion loss on a low frequency side of the pass band compared to the acoustic wave filter according to the comparative example.

Note that in the acoustic wave filter 1 according to the present preferred embodiment, the acoustic wave element 10 according to the first preferred embodiment is preferably used for all of the series arm resonators s1 to s4 but may be used for at least one of the series arm resonators. This may also alleviate the insertion loss in the band on the low frequency side. Further, the acoustic wave element 10 according to the first preferred embodiment may be used for the parallel arm resonator but not for the series arm resonator.

Third Preferred Embodiment

In the first and second preferred embodiments, the acoustic wave element and the acoustic wave filter are described in which the IDT-reflector gap is preferably set to not more than about 0.45 times the reflector wave length, the reflector wave length is preferably set longer than the IDT wave length, and an increase in the return loss on a lower frequency side than the resonant frequency of the acoustic wave resonator (the low frequency end of the stop band) may thus be reduced or prevented even if the number of pairs of electrode fingers of the IDT electrode is decreased.

In the present preferred embodiment, an acoustic wave element will be described in which the IDT-reflector gap is preferably set to not more than about 0.45 times the reflector wave length, the reflector wave length is set longer than the IDT wave length, and an increase in the return loss on a higher frequency side than the anti-resonant frequency of the acoustic wave resonator (a high frequency end of the stop band) may thus be reduced or prevented even if the number of pairs of electrode fingers of the IDT electrode is decreased.

The acoustic wave element according to the present preferred embodiment has the same or substantially the same configuration as the electrode configuration illustrated in FIG. 1. Further, materials of the IDT electrode are preferably the same or substantially the same as the materials of the IDT electrode of the acoustic wave element 10 according to the first preferred embodiment.

A piezoelectric substrate of the acoustic wave element according to the present preferred embodiment is preferably made of a θ° Y cut X propagation LiTaO$_3$ piezoelectric single crystal or piezoelectric ceramics (a single crystal or ceramics of lithium tantalate, which is cut along the plane whose normal line is the axis which is rotated by θ° from the Y axis in the Z-axis direction with the X axis being the central axis and through which a surface acoustic wave propagates in the X-axis direction), for example.

Note that the piezoelectric substrate may be a substrate that includes a piezoelectric layer in at least one portion or may be a laminated structure that includes a piezoelectric layer. The piezoelectric substrate may include a high acoustic velocity support substrate, a low acoustic velocity film, and a piezoelectric layer, for example, and may have a structure in which the high acoustic velocity support substrate, the low acoustic velocity film, and the piezoelectric layer are laminated in this order. In the following, a description will be provided about configurations of the high acoustic velocity support substrate, the low acoustic velocity film, and the piezoelectric layer.

The piezoelectric layer is preferably made of a θ° Y cut X propagation LiTaO$_3$ piezoelectric single crystal or piezoelectric ceramics (a single crystal or ceramics of lithium tantalate, which is cut along the plane whose normal line is the axis which is rotated by θ° from the Y axis in the Z-axis direction with the X axis being the central axis and through which a surface acoustic wave propagates in the X-axis direction), for example.

The high acoustic velocity support substrate and the low acoustic velocity film preferably have the same or substantially the same configurations as the high acoustic velocity support substrate and the low acoustic velocity film according to the first preferred embodiment.

The laminated structure of the piezoelectric substrate enables large improvements of the Q factor of an acoustic wave resonator at the resonant frequency and the anti-resonant frequency compared to a structure that includes a single layer of the piezoelectric substrate. That is, because a surface acoustic wave resonator with a high Q factor is able to be provided, it becomes possible to provide a filter with small insertion loss by using the surface acoustic wave resonator.

Figure 12:
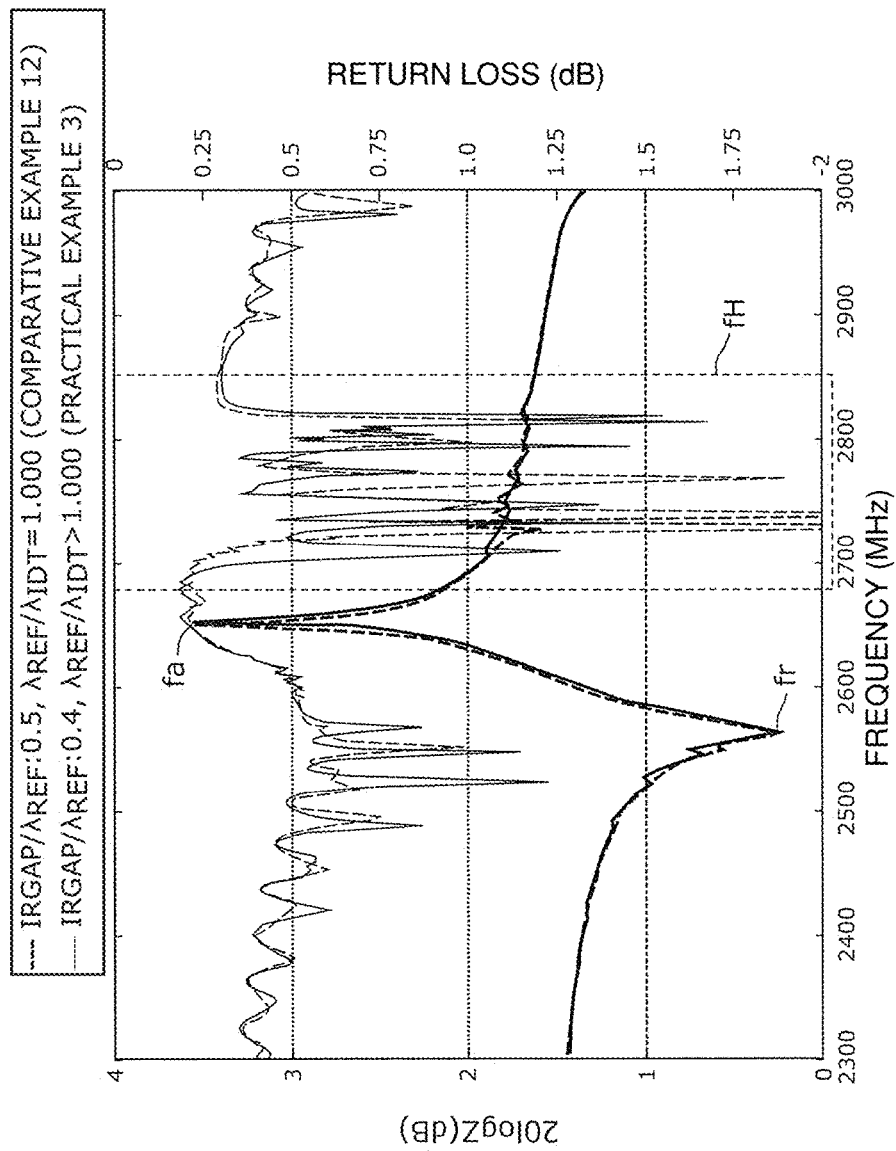
FIG. 12 is a graph that represents the relationship between the impedance characteristics and the reflection characteristics of acoustic wave elements according to a practical example 3 and a comparative example 12.

FIG. 12 is a graph that represents the relationship between the impedance characteristics and the reflection characteristics of the acoustic wave elements according to a practical example 3 and a comparative example 12. FIG. 12 represents the impedance characteristics and the reflection characteristics of the acoustic wave resonator in a case where IRGAP/$\lambda_{REF}$=about 0.500 and $\lambda_{REF}/\lambda_{IDT}$=about 1.000 (comparative example 12) and of the acoustic wave element in a case where IRGAP/$\lambda_{REF}$=about 0.400 and $\lambda_{REF}/\lambda_{IDT}$>about 1.000 (practical example 3). Further, Table 6 represents electrode parameters of the acoustic wave elements according to the practical example 3 and the comparative example 12.

TABLE 6

|  | Practical example 3 | Comparative example 12 |
| --- | --- | --- |
| $\lambda_{IDT}$ (μm) | 1.500 | 1.500 |
| $\lambda_{REF}$ (μm) | 1.5255 | 1.500 |
| $\lambda_{REF}/\lambda_{IDT}$ | 1.017 | 1.000 |
| Number of pairs in IDT (pairs) | 67 | 67 |
| Intersecting width (μm) | 60.00 | 60.00 |
| IRGAP (/$\lambda_{REF}$) | 0.4 | 0.5 |

As represented in Table 6, in the acoustic wave element according to the comparative example 12, the IDT-reflector gap (IRGAP) is about 0.5 times the reflector wave length ($\lambda_{REF}$), but in the acoustic wave element according to the practical example 3, the IDT-reflector gap (IRGAP) is about 0.40 times the reflector wave length ($\lambda_{REF}$). In addition, in the acoustic wave element according to the comparative example 12, the reflector wave length ($\lambda_{REF}$) is equal or substantially equal to the IDT wave length ($\lambda_{IDT}$), but in the acoustic wave element according to the practical example 3, the reflector wave length ($\lambda_{REF}$) is about 1.017 times the IDT wave length ($\lambda_{IDT}$).

In the impedance characteristics in FIG. 12, the resonant frequency fr at which the impedance becomes a local minimum value and the anti-resonant frequency fa at which the impedance becomes a local maximum value are indicated. Meanwhile, in the reflection characteristics in FIG. 12, as for the acoustic wave elements according to the practical example 3 and the comparative example 12, the reflection response is generated on a lower frequency side than the resonant frequency fr (the low frequency end of the stop band) and on a higher frequency side than the anti-resonant frequency fa (the high frequency end of the stop band: in region fH in FIG. 12). Particularly in a case where the acoustic wave element includes the above laminated structure that has the piezoelectric layer, the Q factor of the acoustic wave element becomes high, and the reflection response thus becomes large. As represented in FIG. 12, the frequency at which the reflection response is generated is shifted by changing IRGAP/$\lambda_{REF}$.

Figure 13:
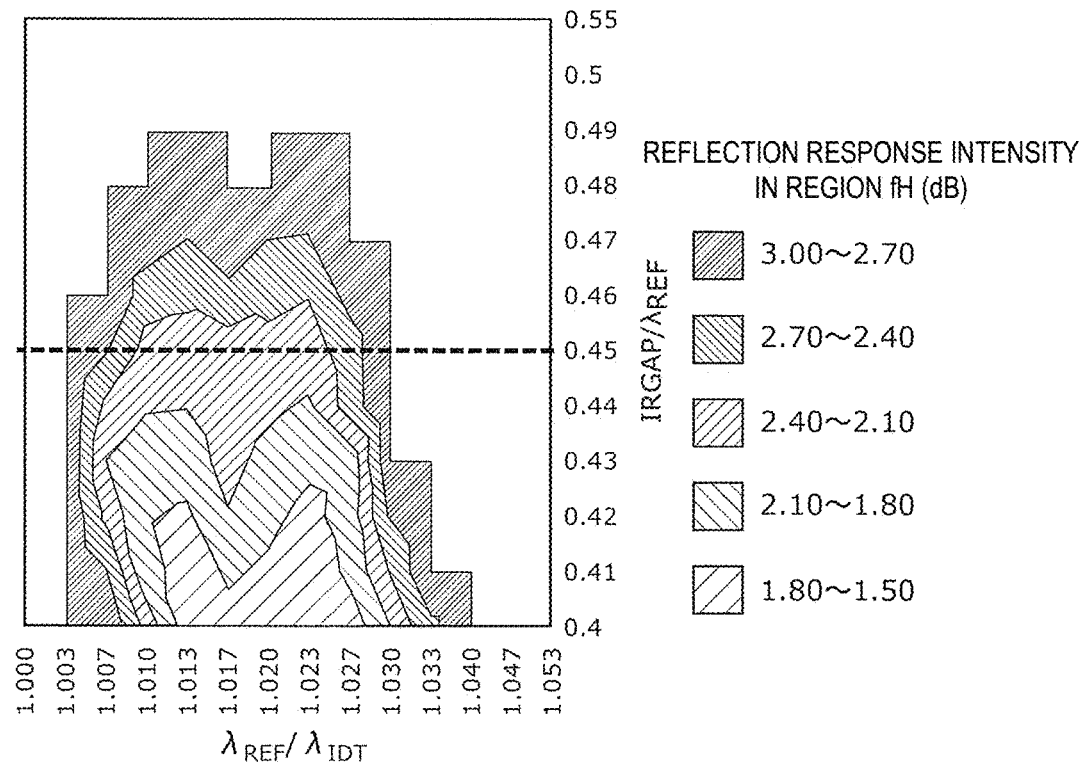
FIG. 13 is a graph that represents reflection response intensity at a high frequency end of a stop band with respect to the changes in the IDT-reflector gap and reflector wave length/IDT wave length.

FIG. 13 is a graph that represents reflection response intensity at the high frequency end of the stop band with respect to the changes in the IDT-reflector gap and reflector wave length/IDT wave length. As represented in this drawing, when $\lambda_{REF}/\lambda_{IDT}$>about 1.000 and IRGAP/$\lambda_{REF}$≤about 0.45, the reflection response intensity (the return loss in FIG. 12) in region fH is reduced. In other words, the position of the high frequency end of the stop band is shifted compared to a case where IRGAP/$\lambda_{REF}$=about 0.5 and $\lambda_{REF}/\lambda_{IDT}$=about 1.000 (comparative example 12), and the generation frequency of response that reflects the generation frequency of the stop band and the reflector wave length may thereby be changed. Accordingly, it becomes possible to disperse the reflection response at the high frequency end of the stop band (region fH).

Figure 14A:
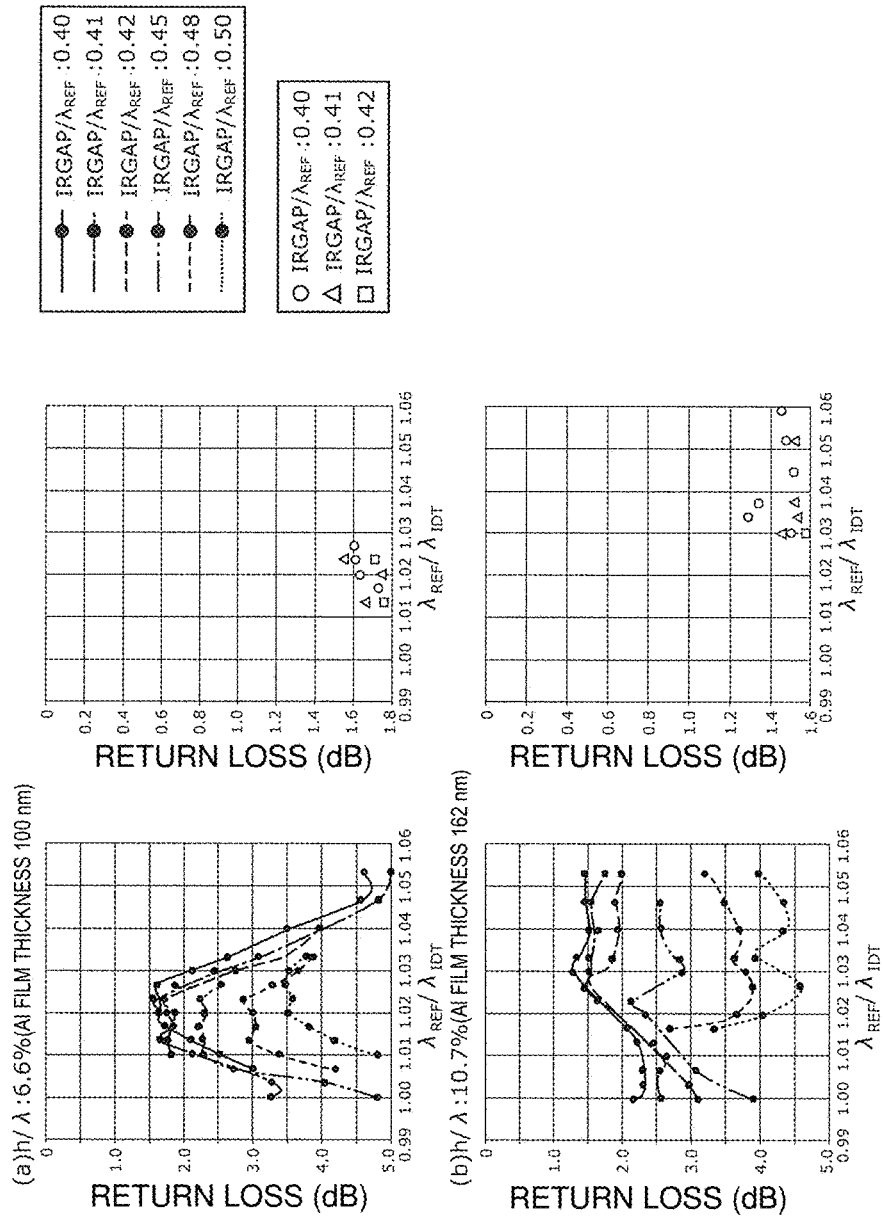
FIG. 14A is a graph that represents return loss at the high frequency end of the stop band with respect to the changes in the IDT-reflector gap, reflector wave length/IDT wave length, and a standardized film thickness.

FIG. 14A is a graph that represents the return loss at the high frequency end of the stop band with respect to the changes in the IDT-reflector gap, reflector wave length/IDT wave length, and a standardized film thickness.

(a) of FIG. 14A represents the return loss in region fH in a case where IRGAP/$\lambda_{REF}$ and $\lambda_{REF}/\lambda_{IDT}$ are changed when a standardized film thickness h/λ of the IDT electrode is about 6.6% (film thickness of IDT electrode=about 100 nm). As represented in the left graph of (a) of FIG. 14A, IRGAP/$\lambda_{REF}$ is set as IRGAP/$\lambda_{REF}$≤about 0.45 when $\lambda_{REF}/\lambda_{IDT}$>about 1.000, and the return loss in region fH is thus reduced. Particularly, in order to make the return loss about 1.8 or smaller, as represented in the right graph in (a) of FIG. 14A, IRGAP/$\lambda_{REF}$ is preferably set to about 0.40 or higher to about 0.41 or lower. Further, in this case, in a case where the standardized film thickness h/λ of the IDT electrode is about 6.6%, $\lambda_{REF}/\lambda_{IDT}$ is preferably about 1.017 or higher to about 1.023 or lower.

Further, (b) of FIG. 14A represents the return loss in region fH in a case where IRGAP/$\lambda_{REF}$ and $\lambda_{REF}/\lambda_{IDT}$ are changed when the standardized film thickness h/λ of the IDT electrode is about 10.7% (film thickness of IDT electrode=about 162 nm). As represented in the left graph of (b) of FIG. 14A, IRGAP/$\lambda_{REF}$ is set as IRGAP/$\lambda_{REF}$≤about 0.45 when $\lambda_{REF}/\lambda_{IDT}$>about 1.000, and the return loss in region fH is thus reduced. Particularly, in order to make the return loss about 1.6 or smaller, as represented in the right graph in (b) of FIG. 14A, IRGAP/$\lambda_{REF}$ is preferably set to about 0.40 or higher to about 0.41 or lower. Further, in this case, in a case where the standardized film thickness h/λ of the IDT electrode is about 10.7%, $\lambda_{REF}/\lambda_{IDT}$ is preferably about 1.027 or higher to about 1.053 or lower.

Figure 14B:
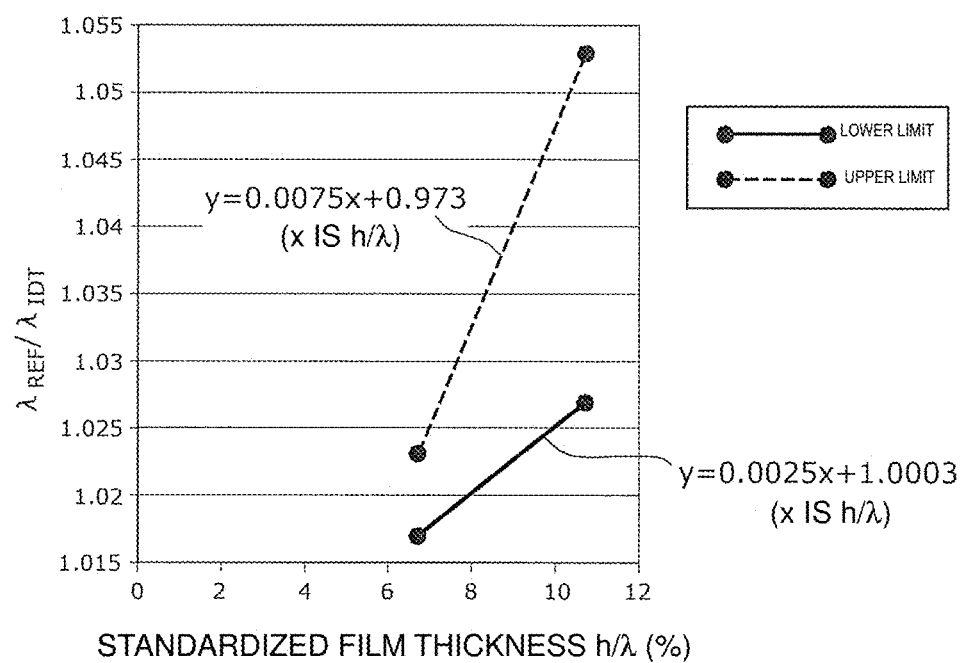
FIG. 14B is a graph that represents the optimal range of reflector wave length/IDT wave length with respect to the standardized film thickness.

FIG. 14B is a graph that represents the optimal range of reflector wave length/IDT wave length with respect to the standardized film thickness. As represented in the right graph in (a) of FIG. 14A and the right graph in (b) of FIG. 14A, in order to make the return loss of the acoustic wave element in region fH about 1.8 or smaller, in a case where the standardized film thickness h/λ is about 6.6%, the lower limit value of $\lambda_{REF}/\lambda_{IDT}$ is about 1.017, and the upper limit value is about 1.023. Further, in a case where the standardized film thickness h/λ is about 10.7%, the lower limit value of $\lambda_{REF}/\lambda_{IDT}$ is about 1.027, and the upper limit value is about 1.053.

Here, in a case where a lower limit value $V_{min}$ of $\lambda_{REF}/\lambda_{IDT}$ is expressed as a linear function of the standardized film thickness h/λ, the following formula 4 is provided.

$$V_{min} = 0.0025 \times \frac{h}{\lambda_{IDT}} + 1.0003 \quad \text{(Formula 4)}$$

Further, in a case where an upper limit value $V_{max}$ of $\lambda_{REF}/\lambda_{IDT}$ is expressed as a linear function of the standardized film thickness h/λ, the following formula 5 is provided.

$$V_{max} = 0.0075 \times \frac{h}{\lambda_{IDT}} + 0.973 \quad \text{(Formula 5)}$$

In other words, in the acoustic wave element according to the present preferred embodiment, the optimal range for reducing the return loss at the high frequency end of the stop band (region fH) is preferably a range in which IRGAP/$\lambda_{REF}$ is about 0.40 or higher to about 0.41 or lower and $\lambda_{REF}/\lambda_{IDT}$ is the lower limit value $V_{min}$ derived from formula 4 to the upper limit value $V_{max}$ derived from formula 5.

Accordingly, the reflection response at the high frequency end of the stop band (region fH) may effectively be dispersed compared to a case where IRGAP/$\lambda_{REF}$=about 0.5 and $\lambda_{REF}/\lambda_{IDT}$=about 1.000. Thus, it becomes possible to effectively reduce or prevent an increase in the return loss on a higher frequency side than the anti-resonant frequency of the acoustic wave resonator (the high frequency end of the stop band).

Fourth Preferred Embodiment

In the present preferred embodiment, a description will be provided of an acoustic wave filter device that uses the acoustic wave element according to the third preferred embodiment. An acoustic wave filter device includes the acoustic wave element according to the third preferred embodiment, and deterioration of the insertion loss in the pass band due to the response characteristics (reflection response) of the IDT electrode as a reflector may thus be reduced or prevented.

In the present preferred embodiment, a description will be provided of a ladder acoustic wave filter that includes the acoustic wave element according to the third preferred embodiment as a parallel arm resonator.

The basic action principle of the ladder acoustic wave filter that is configured with a series arm resonator and a parallel arm resonator is described in the second preferred embodiment and will thus not be described here.

Figure 15A:
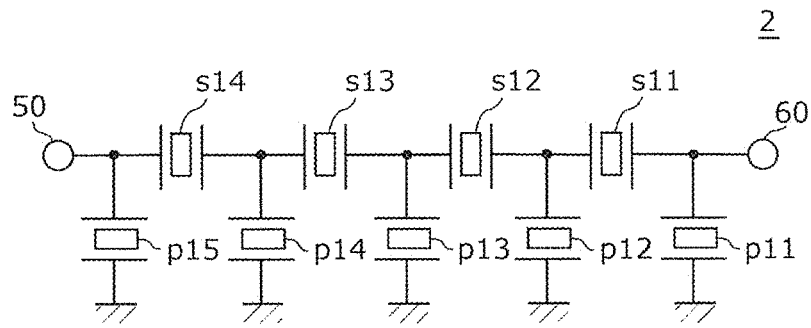
FIG. 15A is a diagram that illustrates a circuit configuration of an acoustic wave filter according to a fourth preferred embodiment of the present invention.

FIG. 15A is a diagram that illustrates a circuit configuration of an acoustic wave filter 2 according to a fourth preferred embodiment of the present invention. As illustrated in FIG. 15A, the acoustic wave filter 2 includes series arm resonators s11, s12, s13, and s14, parallel arm resonators p11, p12, p13, p14, and p15, and the input-output terminals 50 and 60.

The series arm resonators s11 to s14 are connected in series with each other between the input-output terminal 50 and the input-output terminal 60. Further, the parallel arm resonators p11 to p15 are connected in parallel with each other between the connection points, at which the input-output terminal 50, the series arm resonators s11 to s14, and the input-output terminal 60 are respectively connected together, and reference terminals (grounds). In the above connection configuration of the series arm resonators s11 to s14 and the parallel arm resonators p11 to p15, the acoustic wave filter 2 defines a ladder band pass filter. Note that a circuit element, such as an inductor, may be inserted between the parallel arm resonators p11 to p15 and the respective grounds.

Note that it is sufficient that the acoustic wave filter device according to the present invention has a configuration that includes the configuration of the acoustic wave element according to the third preferred embodiment. The circuit configuration illustrated in FIG. 15A is one example thereof, but the number of series arm resonators, the number of parallel arm resonators, connection positions of inductors, and so forth are not limited to the configuration of FIG. 15A. Further, FIG. 15A exemplifies a ladder circuit configuration, but a longitudinally coupled resonant circuit may be included.

Table 7 represents electrode parameters of the resonators of the acoustic wave filter 2 according to the fourth preferred embodiment (practical example). Further, Table 7 represents, in parentheses, electrode parameters of resonators, which define an acoustic wave filter according to a comparative example, as the differences from the acoustic wave filter according to the practical example.

As represented in Table 7, in the acoustic wave filter 2 according to the fourth preferred embodiment (practical example), the acoustic wave element according to the third preferred embodiment is used for the parallel arm resonators p11 to p15.

Figure 15B:
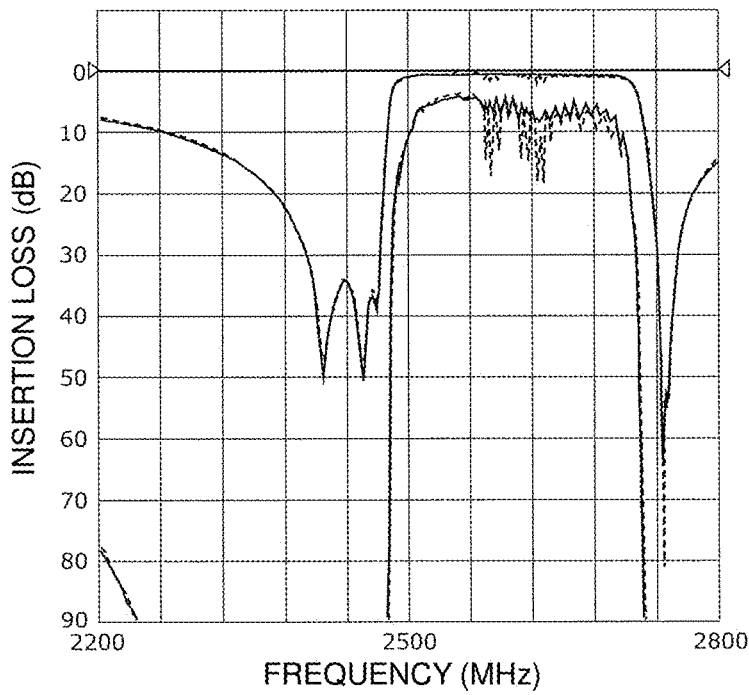
FIG. 15B is a graph that compares the bandpass characteristics of acoustic wave filters according to the fourth preferred embodiment of the present invention (practical example) and a comparative example.

FIG. 15B is a graph that compares the bandpass characteristics of the acoustic wave filters according to the fourth preferred embodiment (practical example) and the comparative example.

In the acoustic wave filter 2 according to the present preferred embodiment, the acoustic wave element according to the third preferred embodiment is used for the parallel arm resonators, and the return loss of the parallel arm resonators may thus be reduced in a pass band on a higher frequency side than the anti-resonant frequency fap of the parallel arm resonators, in other words, in a pass band on a higher band side than an approximate center frequency of the pass band. Thus, as represented in FIG. 15B, the acoustic wave filter 2 according to the practical example is capable of reducing the insertion loss in the vicinity of the center frequency and on a high frequency side in the pass band compared to the acoustic wave filter according to the comparative example.

Note that in the acoustic wave filter 2 according to the present preferred embodiment, the acoustic wave element according to the third preferred embodiment is preferably used for all of the parallel arm resonators p11 to p15, but may be used for at least one of the parallel arm resonators. This may also alleviate the insertion loss in the vicinity of the center frequency and in the band on the high frequency side. Further, the acoustic wave element according to the third preferred embodiment may be used for the series resonator, but not for the parallel arm resonator.

Fifth Preferred Embodiment

In the present preferred embodiment, a description will be provided of a multiplexer in which plural filters, which include the acoustic wave filter 2 according to the fourth preferred embodiment, are directly or indirectly connected to a common terminal.

Figure 16A:
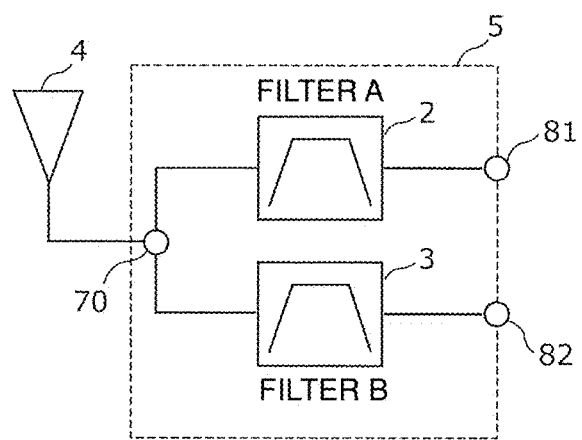
FIG. 16A is a circuit configuration diagram of a multiplexer according to a fifth preferred embodiment of the present invention and a peripheral circuit.

FIG. 16A is a circuit configuration diagram of a multiplexer 5 according to a fifth preferred embodiment of the present invention and a peripheral circuit (antenna 4). The multiplexer 5 illustrated in FIG. 16A includes the acoustic wave filter 2, a filter 3, a common terminal 70, and input-output terminals 81 and 82.

The acoustic wave filter 2 is preferably the acoustic wave filter 2 according to the fourth preferred embodiment, the

TABLE 7

| Practical example (Comparative example) | Series arm resonator s11 | Series arm resonator s12 | Series arm resonator s13 | Series arm resonator s14 | Parallel arm resonator p11 | Parallel arm resonator p12 | Parallel arm resonator p13 | Parallel arm resonator p14 | Parallel arm resonator p15 |
|---|---|---|---|---|---|---|---|---|---|
| $\lambda_{IDT}$ (μm) | 1.476 | 1.425 | 1.456 | 1.424 | 1.551 | 1.587 | 1.560 | 1.547 | 1.597 |
| $\lambda_{REF}$ (μm) | 1.476 | 1.425 | 1.456 | 1.424 | 1.571 (1.551) | 1.607 (1.587) | 1.580 (1.560) | 1.567 (1.547) | 1.618 (1.597) |
| $\lambda_{REF}/\lambda_{IDT}$ | 1.000 | 1.000 | 1.000 | 1.000 | 1.013 (1.000) | 1.013 (1.000) | 1.013 (1.000) | 1.013 (1.000) | 1.013 (1.000) |
| Number of pairs in IDT (pairs) | 163 | 186 | 159 | 119 | 122 | 116 | 164 | 228 | 115 |
| Intersecting width (μm) | 17.47 | 20.55 | 19.71 | 25.97 | 15.05 | 16.16 | 22.06 | 25.49 | 17.80 |
| Number of pairs in REF (pairs) | 15 | 15 | 15 | 15 | 15 | 15 | 15 | 15 | 15 |
| IRGAP ($/\lambda_{REF}$) | 0.5 | 0.5 | 0.5 | 0.5 | 0.4 (0.5) | 0.4 (0.5) | 0.4 (0.5) | 0.4 (0.5) | 0.4 (0.5) | input-output terminal 50 of the acoustic wave filter 2 is connected with the common terminal 70, and the input-output terminal 60 of the acoustic wave filter 2 is connected with the input-output terminal 81.

The filter 3 is connected with the common terminal 70 and the input-output terminal 82. The filter 3 is preferably a ladder acoustic wave filter that includes parallel arm resonators and series arm resonators, for example, but may be an LC filter or the like, and the circuit configuration of the filter 3 is not particularly limited.

Here, the pass band of the acoustic wave filter 2 is located on a lower frequency side than the pass band of the filter 3.

Note that the acoustic wave filter 2 and the filter 3 do not have to be directly connected with the common terminal 70 as illustrated in FIG. 16A but may be indirectly connected with the common terminal 70 with an impedance matching circuit, a phase shifter, a circulator, or a switch element by which two or more filters are selectable interposed therebetween, for example.

Usually, in a multiplexer that has a configuration in which a filter A and a filter B are connected with a common terminal, the insertion loss in a pass band A of the filter A is worsened by receiving an influence of the filter B in addition to the insertion loss of the filter A itself. The insertion loss in the pass band of the filter A is influenced by the reflection characteristics in an attenuation band of the filter B (which corresponds to the pass band of the filter A). More specifically, as for the insertion loss in the pass band of the filter A, as the reflection coefficient in the attenuation band, which corresponds to the pass band of the filter A, in a case where the filter B alone is seen from the common terminal side becomes larger, the insertion loss in the pass band of the filter A is reduced.

Figure 16B:
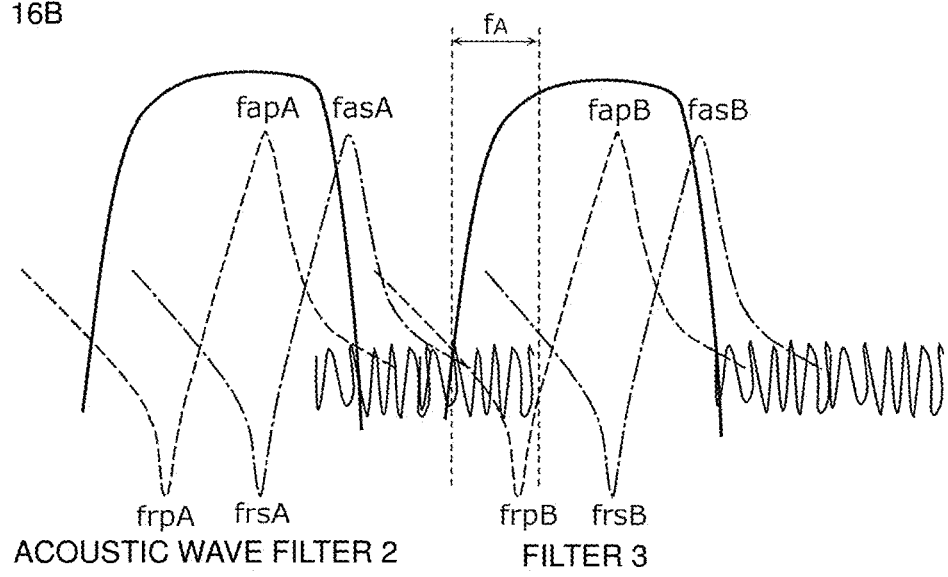
FIG. 16B is a diagram that schematically illustrates the bandpass characteristics of the multiplexer according to the fifth preferred embodiment of the present invention and the impedance characteristics of acoustic wave resonators.

FIG. 16B is a diagram that schematically illustrates the bandpass characteristics of the multiplexer according to the fifth preferred embodiment and the impedance characteristics of acoustic wave resonators. This drawing illustrates the bandpass characteristics of the multiplexer 5 between the common terminal 70 and the input-output terminal 81, the bandpass characteristics between the common terminal 70 and the input-output terminal 82, and the impedance characteristics of the parallel arm resonators and the series arm resonators, which define the acoustic wave filter 2 and the filter 3. The parallel arm resonator that defines the acoustic wave filter 2 has a resonant frequency frpA and an anti-resonant frequency fapA, and the series arm resonator that defines the acoustic wave filter 2 has a resonant frequency frsA and an anti-resonant frequency fasA. Further, the parallel arm resonator that defines the filter 3 has a resonant frequency frpB and an anti-resonant frequency fapB, and the series arm resonator that defines the filter 3 has a resonant frequency frsB and an anti-resonant frequency fasB. Because the pass band of the acoustic wave filter 2 is positioned on a lower frequency side than the pass band of the filter 3, as illustrated in FIG. 16B, resonant frequency frpA<(anti-resonant frequency fapA and resonant frequency frsA)<(anti-resonant frequency fasA and resonant frequency frpB)<(anti-resonant frequency fapB and resonant frequency frsB)<anti-resonant frequency fasB is maintained.

In the acoustic wave filter 2 according to the present preferred embodiment, the acoustic wave element according to the third preferred embodiment is used for the parallel arm resonators, and the return loss of the parallel arm resonators may thus be reduced in the pass band and attenuation band on a higher frequency side than the anti-resonant frequency fapA of the parallel arm resonators. Thus, in the bandpass characteristics between the common terminal 70 and the input-output terminal 81, the insertion loss in the pass band of the acoustic wave filter 2 on a high frequency side is able to be reduced, and the attenuation in the attenuation band on a higher frequency side than the pass band is able to be increased in addition.

The insertion loss in the pass band of the filter 3 connected with the common terminal 70 is worsened by receiving an influence of the acoustic wave filter 2 in addition to the insertion loss of the filter 3 itself. The insertion loss in the pass band of the filter 3 is influenced by the reflection characteristics in the attenuation band of the acoustic wave filter 2 (which corresponds to the pass band of the filter 3). More specifically, as for the insertion loss in the pass band of the filter 3, as the reflection coefficient in the attenuation band (which corresponds to the pass band of the filter 3) in a case where the acoustic wave filter 2 alone is seen from the common terminal 70 side becomes larger, the insertion loss in the pass band of the filter 3 is reduced. In the acoustic wave filter 2 according to the present preferred embodiment, because the attenuation in the attenuation band (which overlaps with the pass band of the filter 3) on a higher frequency side than the pass band may be increased, the insertion loss in the pass band of the filter 3 may be reduced.

Note that in the acoustic wave filter 2 of the multiplexer 5 according to the present preferred embodiment, the acoustic wave element according to the third preferred embodiment is preferably used for all of the parallel arm resonators p11 to p15. However, the acoustic wave element according to the third preferred embodiment may be used for at least only the parallel arm resonator p15 that is close to the common terminal 70. This is due to a fact that the resonator of the acoustic wave filter 2, which is closer to the common terminal 70, provides a larger influence on the insertion loss of the filter 3 connected with the common terminal 70. Further, in this view, in a case where the acoustic wave filter 2 includes three or more parallel arm resonators, it is preferable that the acoustic wave elements according to the third preferred embodiment are used for, among the three or more parallel arm resonators, the parallel arm resonator that is connected closest to the common terminal 70 and the parallel arm resonator that is connected second-closest to the common terminal 70. Accordingly, the insertion loss in the pass band of the filter 3 is able to be effectively reduced.

Note that in the present preferred embodiment, the multiplexer 5 has a circuit configuration in which two filters are connected with the common terminal 70. However, the number of filters connected with the common terminal 70 is not limited to two, and may be three or more. In other words, the multiplexer according to the present invention may include plural filters that include the acoustic wave filter 2, one of an input terminal and an output terminal of each of the plural filters may be directly or indirectly connected with a common terminal, and at least one of the plural filters except for the acoustic wave filter 2 may have a higher pass band than the frequency of the pass band of the acoustic wave filter 2.

Sixth Preferred Embodiment

In the first and the second preferred embodiments of the present invention, the acoustic wave element and the acoustic wave filter are described in which the IDT-reflector gap is preferably set to about 0.45 times or less of the reflector wave length/the reflector wave length is preferably set to be larger than the IDT wave length, and an increase in the reflection loss on a lower frequency side (at a low frequency end of a stop band) than the resonant frequency of the acoustic wave resonator may thus be reduced or prevented even if the number of pairs of electrode fingers of the IDT electrode is decreased. In contrast, in the present preferred embodiment, an acoustic wave element is described in which the IDT-reflector gap is preferably set to about 0.45 times or less of the reflector wave length/the reflector wave length is preferably set to be larger than the IDT wave length, and a stopband response and a longitudinal mode response may be reduced or prevented, and further a Rayleigh wave spurious response may be reduced or prevented.

The acoustic wave element according to the present preferred embodiment preferably has the same or substantially the same configuration as the electrode configuration illustrated in FIG. 1. Further, materials of the IDT electrode are preferably the same or substantially the same as the materials of the IDT electrode of the acoustic wave element 10 according to the first preferred embodiment.

A piezoelectric substrate of the acoustic wave element according to the present preferred embodiment is preferably made of a θ° Y cut X propagation LiTaO$_3$ piezoelectric single crystal or piezoelectric ceramics (a single crystal or ceramics of lithium tantalate, which is cut along the plane whose normal line is the axis which is rotated by θ° from the Y axis in the Z-axis direction with the X axis being the central axis and through which a surface acoustic wave propagates in the X-axis direction), for example.

Note that the piezoelectric substrate may be a substrate that includes a piezoelectric layer in at least one portion or may be a laminated structure that includes a piezoelectric layer. The piezoelectric substrate may include a high acoustic velocity support substrate, a low acoustic velocity film, and a piezoelectric layer, for example, and may have a structure in which the high acoustic velocity support substrate, the low acoustic velocity film, and the piezoelectric layer are laminated in this order.

FIGS. 17A and 17B are graphs that represent the reflection characteristics and the resonance impedance characteristics of an acoustic wave element.

FIG. 17A compares the reflection characteristics of an acoustic wave resonator when the electrode duty ratio of its reflector is about 0.3 (shown by the solid line) and about 0.5 (shown by the broken line).

FIG. 17B represents the impedance characteristics of an acoustic wave resonator when the electrode duty ratio of its reflector is about 0.3 (shown by the solid line) and about 0.5 (shown by the broken line).

The electrode duty ratio is the line width occupancy ratio of electrode fingers of a reflector or an IDT electrode. Specifically, the electrode duty ratio is the ratio of the line width to the addition of the line width of the electrode fingers and the space width therebetween.

As shown in FIG. 17A, the electrode duty ratio of a reflector is set shorter (from about 0.5 to about 0.3), and a Rayleigh wave spurious response generated on a lower frequency side than the resonance frequency fr of an acoustic wave resonator can be reduced.

On the other hand, as shown in FIG. 17B, the electrode duty ratio of a reflector is set shorter (from about 0.5 to about 0.3), and a vertical mode response occurs between the resonance frequency fr and anti-resonance frequency fa of an acoustic wave resonator.

FIGS. 18A and 18B are graphs that represent stopband response intensity and longitudinal mode (in-band) response with respect to the changes in IDT-reflector gap and reflector wave length/IDT wave length.

FIG. 18A represents stopband response intensity and FIG. 18B represents longitudinal mode (in-band) intensity, respectively, when changing reflector wave length/IDT wave length between about 1.000 and about 1.037 and changing an IDT-reflector gap (IRGAP) between about 0.36 and about 0.55 of the reflector wave length, while the electrode duty ratio in a reflector is set to about 0.3 and the electrode duty ratio of an IDT electrode is set to about 0.45 for reduction of Rayleigh wave spurious responses.

According to FIGS. 18A and 18B, an acoustic wave element preferably satisfies the following conditions: (1) the electrode duty ratio of a reflector is set to about 0.3 or less, and the electrode duty ratio of the IDT electrode is larger than about 0.3, (2) Expression 6 derived from FIG. 18A as the range in which stopband response intensity can be reduced or prevented, and (3) Expression 7 and Expression 8 derived from FIG. 18B as the range in which longitudinal mode (in-band) response intensity can be reduced or prevented.

Thus, stopband response and longitudinal mode response can be reduced or prevented compared with the acoustic wave elements in the related art in which the IDT-reflector gap is set to about 0.5 times of the reflector wave length, the reflector wave length is equal to the IDT wave length, and the electrode duty ratio of a reflector is larger than about 0.3.

In addition, setting the electrode duty ratio of a reflector to about 0.3 or less has the effect that Rayleigh waves which tend to concentrate on the surface are less likely to be excited. If the electrode duty ratio of an IDT electrode is also set shorter, the main-mode acoustic wave (SH wave, for example) is also affected. In this regard, by setting only the electrode duty ratio of a reflector to about 0.3 or less, Rayleigh wave can be reduced without deterioration in characteristics.

expression 8

$$\frac{IRGAP}{\lambda_{REF}} \leq 2.724 \times \left(\frac{\lambda_{REF}}{\lambda_{IDT}}\right) - 2.3017 \quad \text{(formula 6)}$$

expression 9

$$\frac{IRGAP}{\lambda_{REF}} \leq -94.328 \times \left(\frac{\lambda_{REF}}{\lambda_{IDT}}\right)^2 + 193.22 \times \left(\frac{\lambda_{REF}}{\lambda_{IDT}}\right) - 98.464 \quad \text{(formula 7)}$$

expression 10

$$\frac{IRGAP}{\lambda_{REF}} \geq 24.028 \times \left(\frac{\lambda_{REF}}{\lambda_{DT}}\right)^2 - 47.833 \times \left(\frac{\lambda_{REF}}{\lambda_{IDT}}\right) + 24.203 \quad \text{(formula 8)}$$

In formulas 6 to 8, the IDT wave length is set as λIDT, the reflector wave length is set as λREF, and the IDT-reflector gap is set as IRGAP.

According to the above configuration, by setting the IDT-reflector gap to about 0.45 times or less of the reflector wave length, a spurious response due to reflection at the boundary between an IDT electrode and a reflector occurs in a periphery of a low frequency end of a stopband of the reflector.

In a state where such a spurious response is generated, a generation frequency of the spurious response is shifted to a low frequency side by making the reflector wave length larger than the IDT wave length, and it thus becomes possible to cancel, by the spurious response, the response characteristics of the IDT electrode as a reflector on a lower frequency side than the resonance frequency of the acoustic wave resonator.

Accordingly, even if the number of pairs of electrode fingers of the IDT electrode is decreased, an increase in the reflection loss on a lower frequency side than the resonance frequency of the acoustic wave resonator is able to be reduced or prevented.

Further, the position of a high frequency end of the stop band is shifted, and the generation frequency of reflection response that reflects the generation frequency of the stop band and the reflector wave length can thus be changed.

Accordingly, it becomes possible to disperse the reflection response at the high frequency end of the stop band (on a higher frequency side than an anti-resonant frequency of the acoustic wave resonator).

Further, stop band response intensity and longitudinal mode (in-band) response intensity can be reduced or prevented by setting the electrode duty ratio of a reflector to about 0.3 or less and by satisfying the above formulas 6 to 8.

Seventh Preferred Embodiment

In a seventh preferred embodiment of the present invention, a description will be provided of an acoustic wave filter including an acoustic wave element according to the first preferred embodiment and the acoustic wave element according to the third embodiment.

An acoustic wave filter device includes the acoustic wave element according to the first and the third preferred embodiments as an acoustic wave resonator, and its power durability and in-band pass characteristics can be improved.

In the present preferred embodiment, a description will be provided of a ladder acoustic wave filter including the acoustic wave element according to the first and third preferred embodiments as a parallel arm resonator.

The basic action principle of the ladder acoustic wave filter that includes a series arm resonator and a parallel arm resonator is described in the second preferred embodiment and will thus not be described here.

Figure 19:
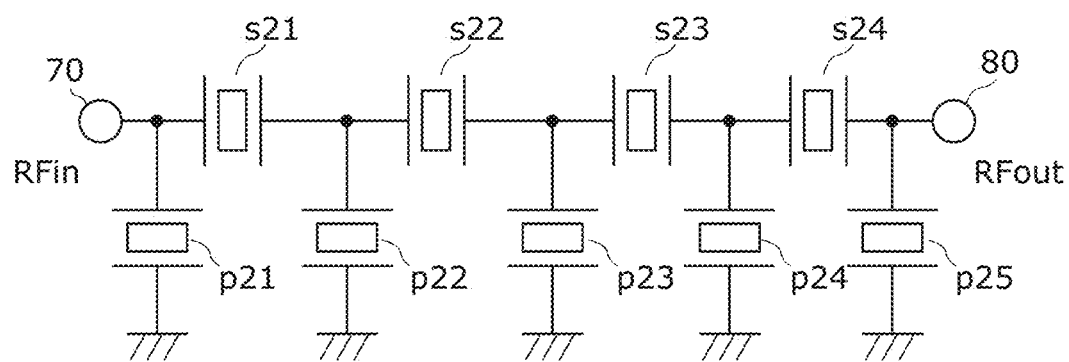
FIG. 19 is a diagram that illustrates a circuit configuration of an acoustic wave filter device according to a seventh preferred embodiment of the present invention.

FIG. 19 is a diagram that illustrates a circuit configuration of the acoustic wave filter 6 according to the seventh preferred embodiment.

As illustrated in FIG. 19, the acoustic wave filter 6 includes series arm resonators s21, s22, s23 and s24, parallel arm resonators p21, p22, p23, p24 and p25, an input terminal 70, and an output terminal 80.

The series arm resonators s21 to s24 are connected in series with each other between the input terminal 70 and the output terminal 80.

The parallel arm resonators p21 to p25 are connected in parallel with each other between the connection points, at which the input terminal 70, the series arm resonators s21 to s24 and the output terminal 70 are respectively connected together, and the reference terminal (ground).

In the above connection configuration of the series arm resonators s21 to s24 and the parallel arm resonators p21 to p25, the acoustic wave filter 1 defines a ladder band pass filter.

Note that a circuit element, such as an inductor, may be inserted between the parallel arm resonators p21 to p25 and the respective grounds.

In the acoustic wave filter 6, among the parallel arm resonators p21 to p25, the parallel arm resonator p21 (the first parallel arm resonator) connected closest to the input terminal 70 is the acoustic wave element according to the first preferred embodiment.

Among the parallel arm resonators p21 to p25, the parallel arm resonators p22 to p25 except the parallel arm resonator p21 include the acoustic wave element according to the third preferred embodiment.

Figure 20A:
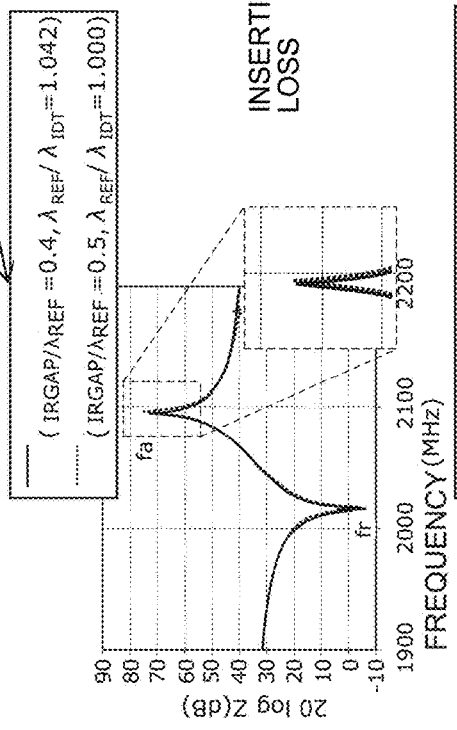
FIGS. 20A and 20B are graphs that represent the relationship between the resonance impedance characteristics and the reflection characteristics of the acoustic wave element.
Figure 20B:
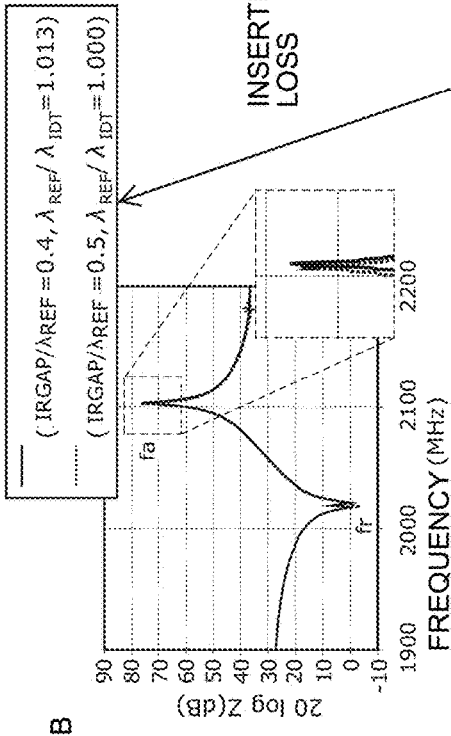

FIGS. 20A and 20B are graphs that represent the relationship between the resonance impedance characteristics and the reflection characteristics of an acoustic wave element.

FIG. 20A compares the impedance characteristics and the reflection characteristics of the acoustic wave element according to the first preferred embodiment (IRGAP/$\lambda_{REF}$=about 0.400 and $\lambda_{REF}/\lambda_{IDT}$=about 1.042), and the impedance characteristics and the reflection characteristics of the acoustic wave element according to a comparative example (IRGAP/$\lambda_{REF}$=about 0.500 and $\lambda_{REF}/\lambda_{IDT}$=about 1.000).

On the other hand, FIG. 20B, compares the impedance characteristics and the reflection characteristics of the acoustic wave element according to the third preferred embodiment (IRGAP/$\lambda_{REF}$=about 0.400 and $\lambda_{REF}/\lambda_{IDT}$=about 1.013), and the impedance characteristics and the reflection characteristics of the acoustic wave element according to a comparative example (IRGAP/$\lambda_{REF}$=about 0.500 and $\lambda_{REF}/\lambda_{IDT}$=about 1.000).

FIG. 20A represents that in the acoustic wave element according to the first preferred embodiment, stopband ripple and longitudinal mode ripple are improved, but the impedance at an anti-resonance point (Q Value) gets worse, as compared with the acoustic wave element according to the comparative example.

On the other hand, in the acoustic wave element according to the third preferred embodiment, stopband ripple and impedance at an anti-resonance point (Q value) are improved, but longitudinal mode ripple gets worse, as compared with the acoustic wave element according to the comparative example.

As a result, an acoustic wave filter includes the acoustic wave element according to the first preferred embodiment as a parallel arm resonator, and insertion loss in the passband increases due to the deterioration in impedance at an anti-resonance point (Q value).

And, an acoustic wave filter includes the acoustic wave element according to the third preferred embodiment as a parallel arm resonator, and power durability in the attenuation band on a lower frequency side than the pass band get worse due to the deterioration in longitudinal mode ripple.

When high-frequency power is applied to the attenuation band, a largest power is applied to the first-stage parallel arm resonator as viewed from the input terminal 70, and thus some measures are required for power resistance in the first-stage parallel arm resonator.

On the other hand, the power resistance measure does not weigh with the parallel arm resonators other than the first stage parallel resonator, because high-frequency power applied thereto is relatively small. In other words, power-resistant performance of the first-stage parallel arm resonator connected closest to the input terminal 70 is dominant in power durability in the attenuation band on a lower frequency side than the pass band.

Accordingly, the acoustic wave filter 6 includes the acoustic wave element according to the first preferred embodiment as the first-stage parallel arm resonator connected closest to the input terminal 70, and the acoustic wave element according to the third preferred embodiment as a parallel arm resonator except the first-stage parallel arm resonator, and its power durability can be improved and its insertion loss can be reduced.

Note that it is sufficient that the acoustic wave filter device 6 according to the present preferred embodiment has a configuration that includes the configuration of the acoustic wave element according to the first preferred embodiment and the configuration of the acoustic wave element according to the third preferred embodiment as a parallel resonator.

The circuit configuration illustrated in FIG. 19 is one example thereof, but the number of series arm resonators, the number of parallel arm resonators, connection positions of the inductors, and so forth are not limited to the configuration of FIG. 19. Further, FIG. 19 exemplifies a ladder circuit configuration, but a longitudinally coupled resonant circuit may be included.

In the foregoing, the acoustic wave elements, the acoustic wave filter devices, and the multiplexer according to the preferred embodiments of the present invention are described with reference to the preferred embodiments and practical examples. However, the acoustic wave elements, the acoustic wave filter devices, and the multiplexers of the present invention are not limited to the above preferred embodiments and practical examples. Other preferred embodiments that are realized by combining arbitrary elements in the above preferred embodiments and practical examples, practical examples obtained by applying various kinds of modifications that are conceived by a person skilled in the art to the above preferred embodiments in the scope that does not depart from the gist of the present invention, and various kinds of apparatuses that incorporate the acoustic wave elements, the acoustic wave filter devices, and the multiplexers of preferred embodiments of the present disclosure are included in the present invention.

For example, the acoustic wave filter 1 according to a preferred embodiment of the present invention may further include circuit elements, such as an inductor and a capacitor, for example.

Further, the acoustic wave element according to a preferred embodiment of the present invention does not have to be the surface acoustic wave resonator in the first preferred embodiment, and may be an acoustic wave resonator that uses a boundary acoustic wave.

Preferred embodiments of the present invention may be widely used as low-loss and small-sized acoustic wave elements, acoustic wave filters, and multiplexers, which may be applied to multi-band and multi-mode frequency standard, for communication apparatuses such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave element that causes a high frequency signal to propagate in a prescribed propagation direction of an acoustic wave, the acoustic wave element comprising:
   a substrate including a piezoelectric layer;
   an IDT electrode provided on the substrate and including one pair of comb-shaped electrodes which are opposed to each other; and
   a reflector provided on the substrate adjacent to the IDT electrode in the propagation direction of the acoustic wave; wherein
   each of the comb-shaped electrodes of the pair of comb-shaped electrodes includes:
      a plurality of electrode fingers extending in a direction intersecting with the propagation direction of the acoustic wave; and
      a busbar electrode connecting respective one ends of the plurality of electrode fingers together;
   the reflector includes a plurality of reflector electrode fingers extending in the direction intersecting with the propagation direction of the acoustic wave; and
   in a case where IRGAP is an IDT-reflector gap, which is a distance between a center of one of the plurality of electrode fingers located closest to the reflector and a center of one of the plurality of reflector electrode fingers located closest to the IDT electrode in a boundary region between the IDT electrode and the reflector, and $\lambda_{REF}$ is a reflector wave length that is twice a repetition pitch of the plurality of reflector electrode fingers, a ratio of about $0.40 \leq IRGAP/\lambda_{REF} \leq$ about $0.41$ is satisfied; and
   the reflector wave length, $\lambda_{REF}$, is longer than an IDT wave length, $\lambda_{IDT}$, that is a repetition pitch of the plurality of electrode fingers of the comb-shaped electrode.

2. The acoustic wave element according to claim 1, wherein the substrate includes:
   the piezoelectric layer on one main surface of which the IDT electrode is provided;
   a high acoustic velocity support substrate in which an acoustic velocity of a propagating bulk wave is higher than an acoustic velocity of an acoustic wave which propagates through the piezoelectric layer; and
   a low acoustic velocity film disposed between the high acoustic velocity support substrate and the piezoelectric layer, and in which an acoustic velocity of a propagating bulk wave is lower than the acoustic velocity of the acoustic wave which propagates through the piezoelectric layer.

3. The acoustic wave element according to claim 1, wherein a frequency of a spurious response that is generated due to the IDT-reflector gap is lower than a resonant frequency of an acoustic wave resonator defined by the IDT electrode and the reflector.

4. The acoustic wave element according to claim 1, wherein the IDT-reflector gap and the reflector wave length satisfy a relational expression:

$$1.003170-0.130362\times(IRGAP/\lambda_{REF}-0.401025)-0.334499\times(\lambda_{REF}/\lambda_{IDT}-1.009606)<1.$$

5. The acoustic wave element according to claim 1, wherein in a case where a standardized film thickness as a ratio of a film thickness h of the IDT electrode to the IDT wave length is set as $h/\lambda_{IDT}$, $\lambda_{REF}/\lambda_{IDT}$ as a ratio of the reflector wave length to the IDT wave length is a lower limit value $V_{min}$ or greater and an upper limit value $V_{max}$ or less, the lower limit value $V_{min}$ and the upper limit value $V_{max}$ being provided by relational expressions:

$$V_{min} = 0.0025 \times \frac{h}{\lambda_{IDT}} + 1.0003$$

$$V_{max} = 0.0075 \times \frac{h}{\lambda_{IDT}} + 0.973.$$

6. The acoustic wave element according to claim 1, wherein in a case where an electrode duty ratio of the reflector is set to about 0.3 or less and an electrode duty ratio of the IDT electrode is set greater than about 0.3 or less, the IDT wave length, the reflector wave length, and the IDT-reflector gap satisfy an expression:

$$\frac{IRGAP}{\lambda_{REF}} \leq 2.724 \times \left(\frac{\lambda_{REF}}{\lambda_{IDT}}\right) - 2.3017$$

-continued $$\frac{IRGAP}{\lambda_{REF}} \leq -94.328 \times \left(\frac{\lambda_{REF}}{\lambda_{IDT}}\right)^2 + 193.22 \times \left(\frac{\lambda_{REF}}{\lambda_{IDT}}\right) - 98.464$$

$$\frac{IRGAP}{\lambda_{REF}} \geq 24.028 \times \left(\frac{\lambda_{REF}}{\lambda_{IDT}}\right)^2 - 47.833 \times \left(\frac{\lambda_{REF}}{\lambda_{IDT}}\right) + 24.203.$$

7. An acoustic wave filter device comprising:
the acoustic wave element according to claim 1.

8. The acoustic wave filter device according to claim 7, wherein
the substrate includes:
the piezoelectric layer on one main surface of which the IDT electrode is provided;
a high acoustic velocity support substrate in which an acoustic velocity of a propagating bulk wave is higher than an acoustic velocity of an acoustic wave which propagates through the piezoelectric layer; and
a low acoustic velocity film disposed between the high acoustic velocity support substrate and the piezoelectric layer, and in which an acoustic velocity of a propagating bulk wave is lower than the acoustic velocity of the acoustic wave which propagates through the piezoelectric layer.

9. The acoustic wave filter device according to claim 7, wherein a frequency of a spurious response that is generated due to the IDT-reflector gap is lower than a resonant frequency of an acoustic wave resonator defined by the IDT electrode and the reflector.

10. The acoustic wave filter device according to claim 7, wherein the IDT-reflector gap and the reflector wave length satisfy a relational expression:

1.003170−0.130362×(IRGAP/$\lambda_{REF}$−0.401025)−
0.334499×($\lambda_{REF}$/$\lambda_{IDT}$−1.009606)<1.

11. The acoustic wave filter device according to claim 7, wherein in a case where a standardized film thickness as a ratio of a film thickness h of the IDT electrode to the IDT wave length is set as h/$\lambda_{IDT}$, $\lambda_{REF}$/$\lambda_{IDT}$ as a ratio of the reflector wave length to the IDT wave length is a lower limit value $V_{min}$ or greater and an upper limit value $V_{max}$ or less, the lower limit value $V_{min}$ and the upper limit value $V_{max}$ being provided by relational expressions:

$$V_{min} = 0.0025 \times \frac{h}{\lambda_{IDT}} + 1.0003$$

$$V_{max} = 0.0075 \times \frac{h}{\lambda_{IDT}} + 0.973.$$

12. The acoustic wave filter device according to claim 7, further comprising:
a first input-output terminal and a second input-output terminal; and
a parallel arm resonator connected with a ground and a node in a path which couples the first input-output terminal and the second input-output terminal together; wherein
the acoustic wave element is a series arm resonator that is connected between the first input-output terminal and the second input-output terminal.

13. An acoustic wave filter device comprising:
a first input-output terminal and a second input-output terminal;
a series arm resonator connected between the first input-output terminal and the second input-output terminal; and
a parallel arm resonator connected with a ground and a node in a path which couples the first input-output terminal and the second input-output terminal together; wherein
the parallel arm resonator includes the acoustic wave element according to claim 1.

14. An acoustic wave filter device comprising:
a first input terminal and a first output terminal;
a series arm resonator that is connected between the first input terminal and the first output terminal; and
a plurality of parallel arm resonators that are connected with a ground and a node in a path which couples the first input terminal and the first output terminal together; wherein
a first parallel arm resonator connected closest to the first input terminal among the plurality of parallel arm resonators includes an acoustic wave element including:
a substrate including a piezoelectric layer;
an IDT electrode provided on the substrate and including one pair of comb-shaped electrodes which are opposed to each other; and
a reflector provided on the substrate adjacent to the IDT electrode in the propagation direction of the acoustic wave; wherein
each of the comb-shaped electrodes of the pair of comb-shaped electrodes includes:
a plurality of electrode fingers extending in a direction intersecting with the propagation direction of the acoustic wave; and
a busbar electrode connecting respective one ends of the plurality of electrode fingers together;
the reflector includes a plurality of reflector electrode fingers extending in the direction intersecting with the propagation direction of the acoustic wave;
in a case where IRGAP is an IDT-reflector gap, which is a distance between a center of one of the plurality of electrode fingers located closest to the reflector and a center of one of the plurality of reflector electrode fingers located closest to the IDT electrode in a boundary region between the IDT electrode and the reflector, and $\lambda_{REF}$ is a reflector wave length that is twice a repetition pitch of the plurality of reflector electrode fingers, a ratio of about 0.25≤IRGAP/$\lambda_{REF}$≤about 0.44 is satisfied; and
the reflector wave length, $\lambda_{REF}$, is longer than an IDT wave length, $\lambda_{IDT}$, that is a repetition pitch of the plurality of electrode fingers of the comb-shaped electrode; and
a parallel arm resonator, except the first parallel resonator, among the plurality of parallel arm resonators includes the acoustic wave element according to claim 5.

15. The acoustic wave filter device according to claim 14, wherein the substrate includes:
the piezoelectric layer on one main surface of which the IDT electrode is provided;
a high acoustic velocity support substrate in which an acoustic velocity of a propagating bulk wave is higher than an acoustic velocity of an acoustic wave which propagates through the piezoelectric layer; and
a low acoustic velocity film disposed between the high acoustic velocity support substrate and the piezoelectric layer, and in which an acoustic velocity of a propagating bulk wave is lower than the acoustic velocity of the acoustic wave which propagates through the piezoelectric layer.

16. The acoustic wave filter device according to claim 14, wherein a frequency of a spurious response that is generated due to the IDT-reflector gap is lower than a resonant frequency of an acoustic wave resonator defined by the IDT electrode and the reflector.

17. The acoustic wave filter device according to claim 14, wherein the IDT-reflector gap and the reflector wave length satisfy a relational expression:

1.003170−0.130362×(IRGAP/$\lambda_{REF}$−0.401025)−0.334499×($\lambda_{REF}$/$\lambda_{IDT}$−1.009606)<1.

18. The acoustic wave filter device according to claim 14, wherein
the ratio of the IDT-reflector gap to reflector wave length is about 0.40 or greater and about 0.41 or less; and
in a case where a standardized film thickness as a ratio of a film thickness h of the IDT electrode to the IDT wave length is set as h/$\lambda_{IDT}$, $\lambda_{REF}$/$\lambda_{IDT}$ as a ratio of the reflector wave length to the IDT wave length is a lower limit value $V_{min}$ or greater and an upper limit value $V_{max}$ or less, the lower limit value $V_{min}$ and the upper limit value $V_{max}$ being provided by relational expressions:

$$V_{min} = 0.0025 \times \frac{h}{\lambda_{IDT}} + 1.0003$$

$$V_{max} = 0.0075 \times \frac{h}{\lambda_{IDT}} + 0.973.$$

19. A multiplexer comprising:
a plurality of filters that include the acoustic wave filter device according to claim 14; wherein
one of an input terminal and an output terminal of each of the plurality of filters is directly or indirectly connected to a common terminal; and
at least one of the plurality of filters except for the acoustic wave filter device has a higher pass band than a frequency of a pass band of the acoustic wave filter device.

* * * * *